US010477686B2

(12) United States Patent
Miyasaka et al.

(10) Patent No.: US 10,477,686 B2
(45) Date of Patent: Nov. 12, 2019

(54) PRINTED CIRCUIT BOARD

(71) Applicant: CANON KABUSHIKI KAISHA, Tokyo (JP)

(72) Inventors: Jin Miyasaka, Nagareyama (JP); Masanori Kikuchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/038,707

(22) Filed: Jul. 18, 2018

(65) Prior Publication Data

US 2019/0037697 A1 Jan. 31, 2019

(30) Foreign Application Priority Data

Jul. 26, 2017 (JP) ................................ 2017-144925
May 15, 2018 (JP) ................................ 2018-094135

(51) Int. Cl.
*H05K 1/18* (2006.01)
*H05K 1/02* (2006.01)
*H02M 1/44* (2007.01)
*H05K 1/11* (2006.01)
*H02M 7/5387* (2007.01)
*H05K 1/16* (2006.01)

(52) U.S. Cl.
CPC ............. *H05K 1/181* (2013.01); *H02M 1/44* (2013.01); *H02M 7/5387* (2013.01); *H05K 1/0231* (2013.01); *H05K 1/0298* (2013.01); *H05K 1/118* (2013.01); *H05K 1/0206* (2013.01); *H05K 1/0265* (2013.01); *H05K 1/165* (2013.01); *H05K 2201/10689* (2013.01)

(58) Field of Classification Search
CPC .. H05K 1/0206; H05K 1/0231; H05K 1/0265; H05K 1/0298; H05K 1/118; H05K 1/181; H05K 1/165; H05K 2201/10689; H02M 7/5387; H02M 1/44
See application file for complete search history.

(56) References Cited

U.S. PATENT DOCUMENTS

| 5,912,809 | A | * | 6/1999 | Steigerwald | ......... | H05K 1/0262 |
| | | | | | | 174/255 |
| 7,692,300 | B2 | | 4/2010 | Kikuchi | | |
| 9,456,489 | B2 | | 9/2016 | Kikuchi | | |
| 9,907,155 | B2 | | 2/2018 | Numagi | | |

(Continued)

FOREIGN PATENT DOCUMENTS

WO 2013/132528 A1 9/2013

*Primary Examiner* — Hoa C Nguyen
(74) *Attorney, Agent, or Firm* — Venable LLP

(57) ABSTRACT

A printed circuit board includes a power input terminal, a positive trunk line, a negative trunk line, a first switching circuit, a second switching circuit, a first positive wire, a second positive wire, a first capacitor, a second capacitor, and a bypass circuit. The first positive wire connecting the positive trunk line with the first switching circuit without passing through the second switching circuit. The second positive wire connecting the positive trunk line with the second switching circuit without passing through the first switching circuit. The first capacitor provided between the first positive wire and the negative trunk line. The second capacitor provided between the second positive wire and the negative trunk line. The bypass circuit connecting the first positive wire with the second positive wire.

16 Claims, 30 Drawing Sheets

(56) References Cited

U.S. PATENT DOCUMENTS

| | | | |
|---|---|---|---|
| 10,263,505 B2* | 4/2019 | Schiedermeier | H02M 1/126 |
| 2012/0155043 A1 | 6/2012 | Miyasaka | |
| 2015/0124412 A1* | 5/2015 | Keegan | H02M 7/5387 |
| | | | 361/734 |
| 2016/0315038 A1* | 10/2016 | Sato | H01L 23/057 |
| 2017/0244358 A1* | 8/2017 | Moslehi | H02S 40/34 |
| 2017/0303391 A1 | 10/2017 | Miyasaka | |
| 2017/0324316 A1* | 11/2017 | Araki | H02M 1/08 |
| 2018/0007785 A1* | 1/2018 | Kamikura | H02M 5/458 |
| 2018/0247889 A1* | 8/2018 | Nagasato | H01L 23/49844 |
| 2018/0342973 A1* | 11/2018 | Li | H02M 1/44 |
| 2019/0207488 A1* | 7/2019 | Ichikawa | H02K 11/30 |

\* cited by examiner

— A   BYPASS CIRCUIT IS PRESENT

–·–·– B   NO BYPASS CIRCUIT

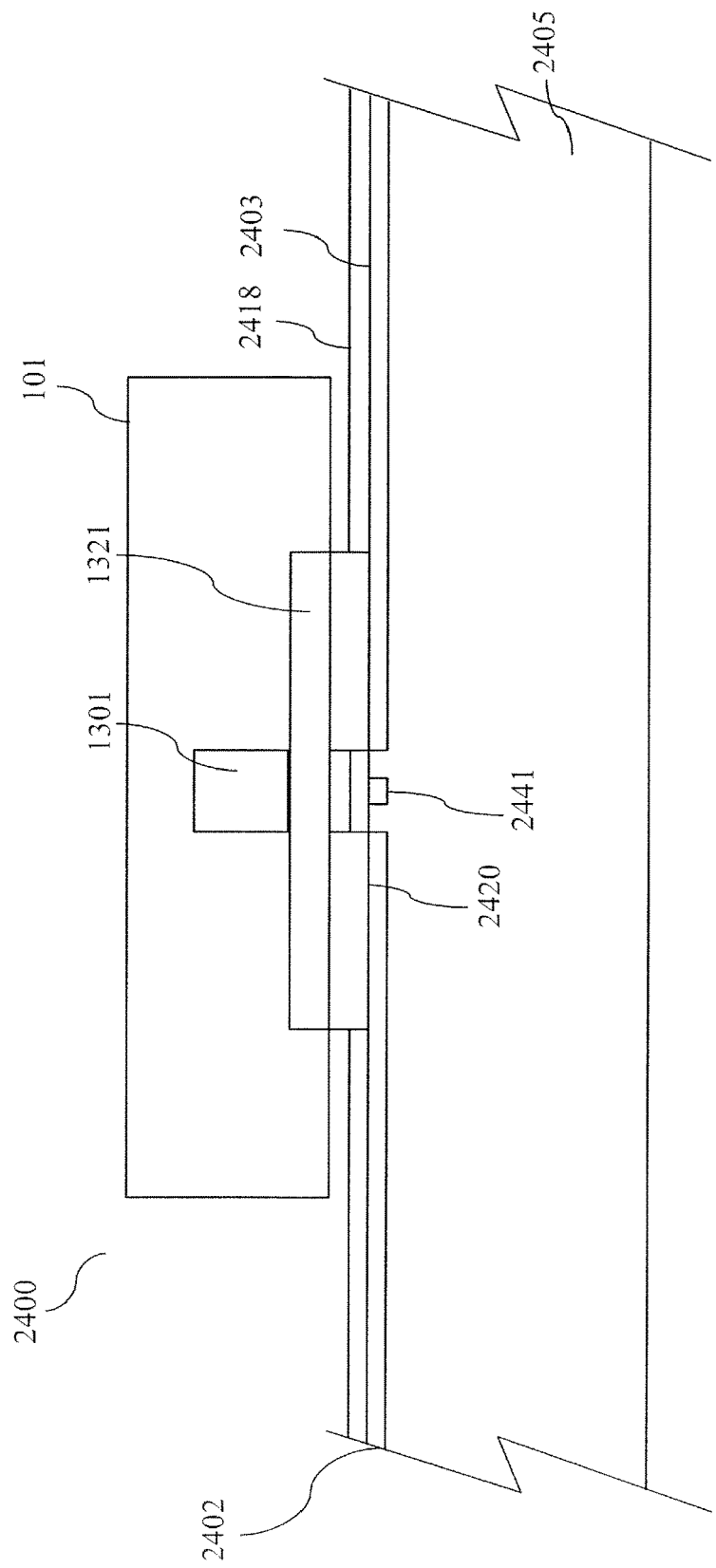

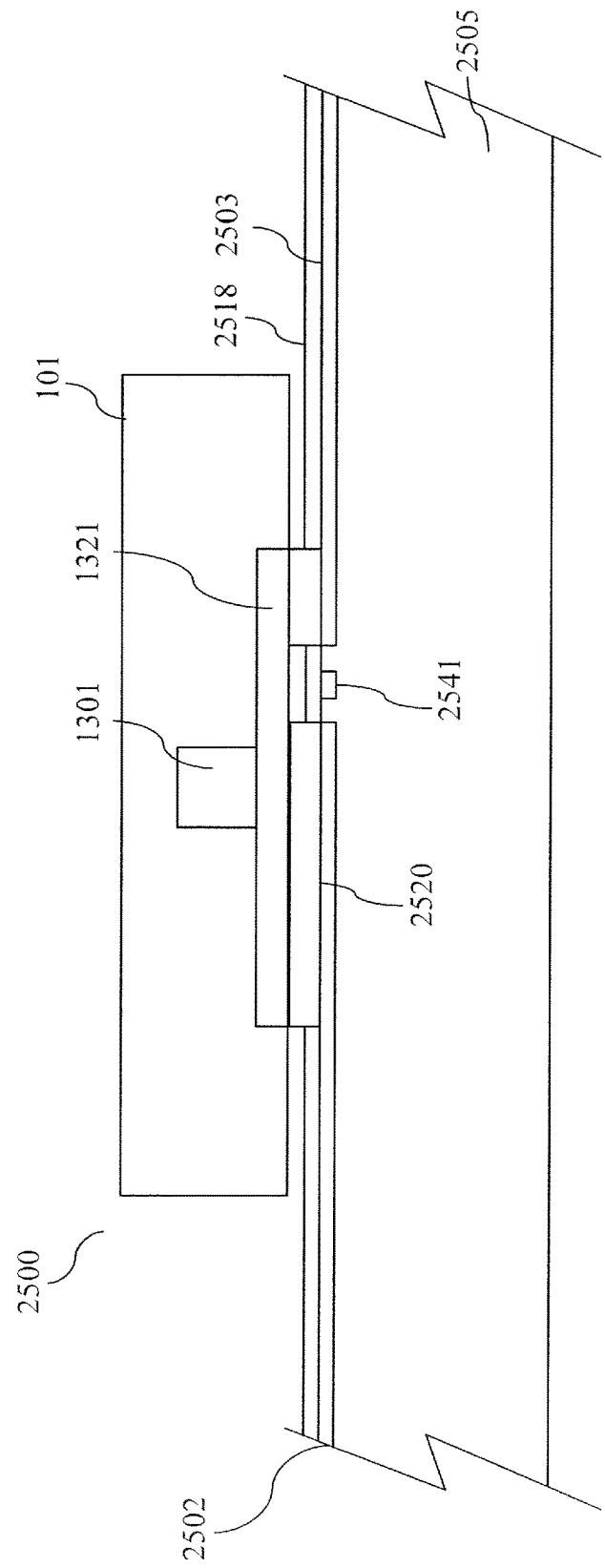

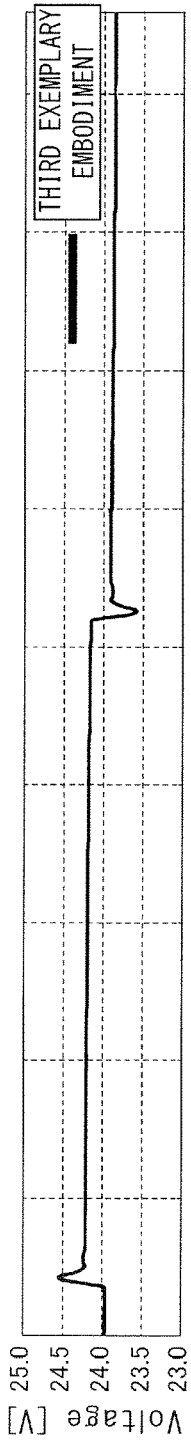
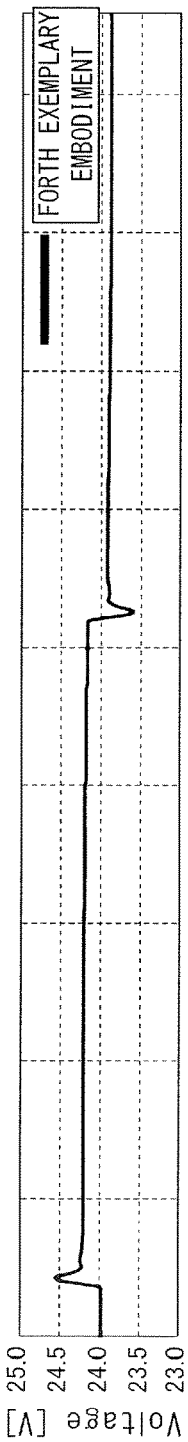
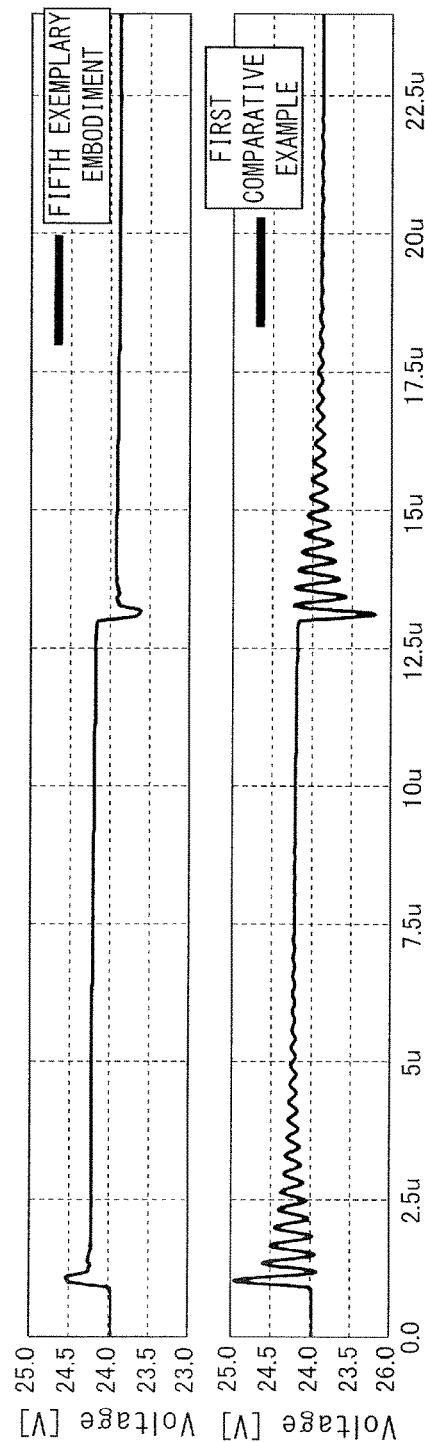
FIG.26A
FIG.26B
FIG.26C
FIG.26D

PRINTED CIRCUIT BOARD

BACKGROUND OF THE INVENTION

Field of the Invention

The present disclosure relates to a printed circuit board for supplying power mounted in an electronic device and others and typically to a printed circuit board configured to supply power of each phase to a polyphase motor.

Description of the Related Art

While a large-current driving circuit such as a motor driver mounted in an electronic device controls power by causing a driver element such as a semiconductor element to perform switching operations, the driver element sometimes causes fluctuation of power supply voltage along with the switching operations. If the fluctuation occurs, radiation of noise occurs due to a positive line of the power supply and wires and cables on a printed circuit board that become an antenna, possibly inducing erroneous operations in the electronic device itself or in other electronic devices.

Lately in particular, expectation on a motor that is driven in high-speed response is growing, and a driving element such as a power MOSFET with fast switching speed is started to be used. If such a driving element is operated in high speed, power source voltage fluctuates with high frequency, causing such a problem that radiated noise is generated in a frequency range higher than before.

Then, proposals for solving such problem of the radiated noise have been made.

For instance, while a plurality of capacitors is connected in parallel between positive and negative lines connecting a power supply and a power converting unit, e.g., semiconductor switching elements, in a device disclosed in International Publication No. 2013/132528, the capacitors are disposed such that the closer the power converting unit, the smaller the capacitance of the capacitors. Thereby, power supply impedance near the power converting unit is lowered to suppress the source voltage fluctuation in a high-frequency range.

However, if a set of the plurality of capacitors in International Publication No. 2013/132528 is provided in a circuit in which a plurality of power converting units is connected to a power supply such as a circuit for supplying a polyphase driving signal to a polyphase motor for example, a distance to the capacitor is prolonged in the power converting unit. Therefore, there is a case where wiring impedance becomes too high, disabling to exhibit enough noise reduction effect. Still further, because the distances from the plurality of capacitors to the power converting units are prolonged, supply of power is delayed with respect to the high-speed switching operations, possibly causing a problem that the power cannot be supplied efficiently to the motor, i.e., a load.

SUMMARY OF THE INVENTION

According to one aspect of the present invention, a printed circuit board includes a power input terminal, a positive trunk line connected with a positive electrode of the power input terminal, a negative trunk line connected with a negative electrode of the power input terminal, a first switching circuit controlling connection/disconnection of power supply to a load, a second switching circuit controlling connection/disconnection of power supply to a load, a first positive wire connecting the positive trunk line with the first switching circuit without passing through the second switching circuit, a second positive wire connecting the positive trunk line with the second switching circuit without passing through the first switching circuit, a first capacitor provided between the first positive wire and the negative trunk line, a second capacitor provided between the second positive wire and the negative trunk line, and a bypass circuit connecting the first positive wire with the second positive wire.

Further features of the present invention will become apparent from the following description of exemplary embodiments with reference to the attached drawings.

BRIEF DESCRIPTION OF THE DRAWINGS

FIG. 24 is a section view of a printed circuit board of a fourth exemplary embodiment.

FIG. 25 is a section view of a printed circuit board of a fifth exemplary embodiment.

FIG. 26A is a graph indicating source voltage fluctuation of the third exemplary embodiment.

FIG. 26B is a graph indicating source voltage fluctuation of the fourth exemplary embodiment.

FIG. 26C is a graph indicating source voltage fluctuation of the fifth exemplary embodiment.

FIG. 26D is a graph indicating source voltage fluctuation of the first comparative example.

DESCRIPTION OF THE EMBODIMENTS

Modes for carrying out the present disclosure will be detailed below with reference to the drawings.

First Embodiment

Figure 1:
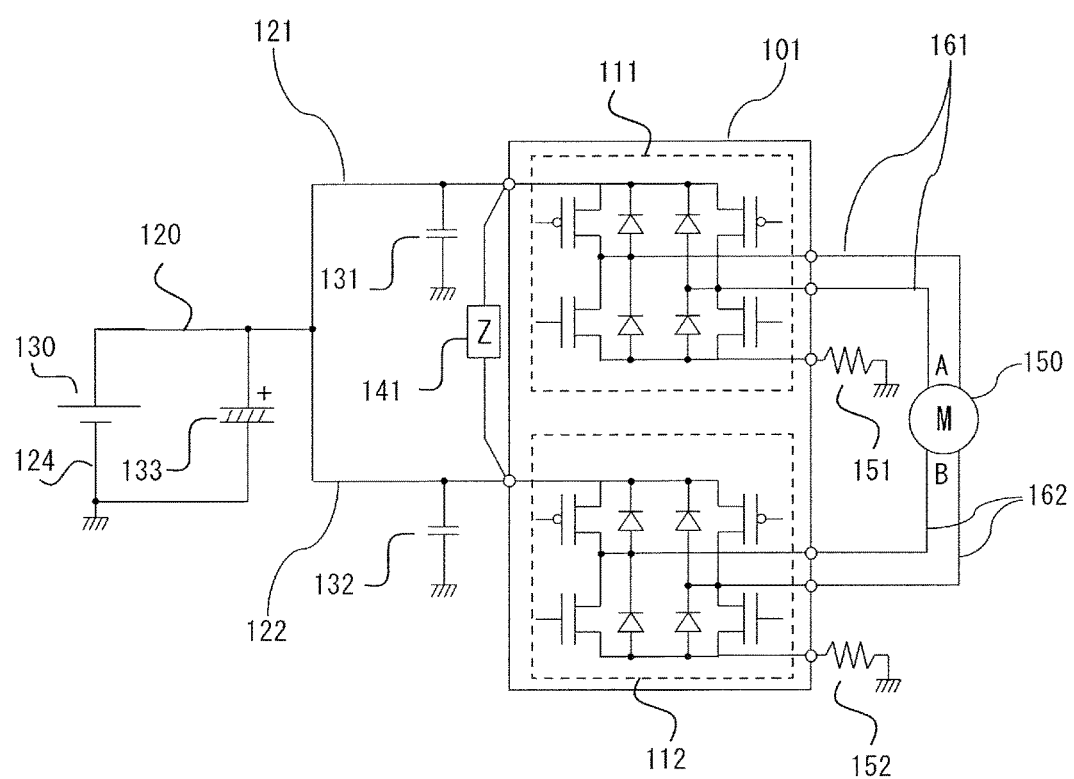
FIG. 1 is a circuit diagram of a first embodiment.

FIG. 1 is a circuit diagram of a printed circuit board of a first embodiment of the present disclosure. The circuit diagram illustrates the printed circuit board of the present embodiment that drives a motor 150 operative in two-phases of phases-A and B. A power supplying circuit includes a power source 130 and a driving IC 101. The driving IC 101 includes a switching circuit 111 for use in phase-A and a switching circuit 112 for use in phase-B that can control connection/disconnection of power supply to a load.

While a push-pull circuit composed of MOSFETs and diodes, i.e., semiconductor devices, is used in the switching circuits 111 and 112 as illustrated in FIG. 1, other devices or other circuit formats may be adopted. It is noted that while only the two push-pull type switching circuits are illustrated within the driving IC 101 for convenience of the illustration, more switching circuits and control circuits may be incorporated in the driving IC.

Among output terminals of the power source 130, a positive electrode is connected with a positive line 120 serving as a positive trunk line, and a negative electrode is connected with a negative line 124 serving as a negative trunk line. The positive line 120 is branched to a first positive wire 121 connected with the switching circuit 111 for use in phase-A and to a second positive wire 122 connected with the switching circuit 112 for use in phase-B. In other words, the first positive wire 121 connects the positive line 120 with the switching circuit 111 for use in phase-A without passing through the switching circuit 112 for use in phase-B. Similarly to that, the second positive wire 122 connects the positive line 120 with the switching circuit 112 for use in phase-B without passing through the switching circuit 111 for use in phase-A. The negative line 124 serving as the negative trunk line is electrically earthed.

The first positive wire 121 and the second positive wire 122 supply power source voltage to the switching circuit 111 serving as a first switching circuit and to the switching circuit 112 serving as a second switching circuit through different power input terminals of the driving IC, respectively.

The switching circuit 111 is electrically connected with the negative line 124 by being earthed through a current sensing resistance 151. In the same manner, the switching circuit 112 is electrically connected with the negative line 124 by being earthed through a current sensing resistance 152. It is noted that a current feedback circuit for adjusting a quantity of current to be flown to the motor by estimating a motor current from a current flowing through the current sensing resistance is not illustrated here. The respective switching circuits may be also connected with the negative line 124 without passing through the current sensing resistance or a current limiting resistor.

The switching circuit 111 outputs the power source voltage supplied through the first positive wire 121 adequately intermittently by inputting an adequate control signal to gates of incorporated PMOS and NMOS and supplies a phase-A signal to the motor 150 through phase-A output lines 161.

In the same manner, the switching circuit 112 outputs the power source voltage supplied through the second positive wire 122 adequately intermittently by inputting an adequate control signal to gates of the incorporated PMOS and NMOS and supplies a phase-B signal to the motor 150 through phase-B output lines 162.

An electrolytic capacitor 133 is connected between the positive line 120 serving as the positive trunk line and the negative line 124 serving as the negative trunk line as a capacitor having a large capacitance for supplying low-frequency power to the driving IC 101.

Still further, a capacitor 131 is electrically connected between the first positive wire 121 and the negative line 124 as a high-speed capacitor for supplying high frequency power to the driving IC 101. In the same manner, a capacitor 132 is electrically connected between the second positive wire 122 and the negative line 124 as a high-speed capacitor for supplying high frequency power to the driving IC 101. The capacitor 131 and the capacitor 132 are provided at positions close to power input terminals of the driving IC 101, and a laminated ceramic chip capacitor is used for example. It is noted that an electrolytic capacitor 133 as a third capacitor has capacitance greater than those of the capacitor 131 serving as the first capacitor and the capacitor 132 serving as the second capacitor.

According to the present embodiment, a bypass circuit 141 connecting the first positive wire 121 with the second positive wire 122 at the position close to the power input terminals of the driving IC 101 is also provided. An operation of the bypass circuit 141 will be described later in detail.

Next, a circuit configuration of the printed circuit board of the present embodiment will be specifically described.

Figure 2:
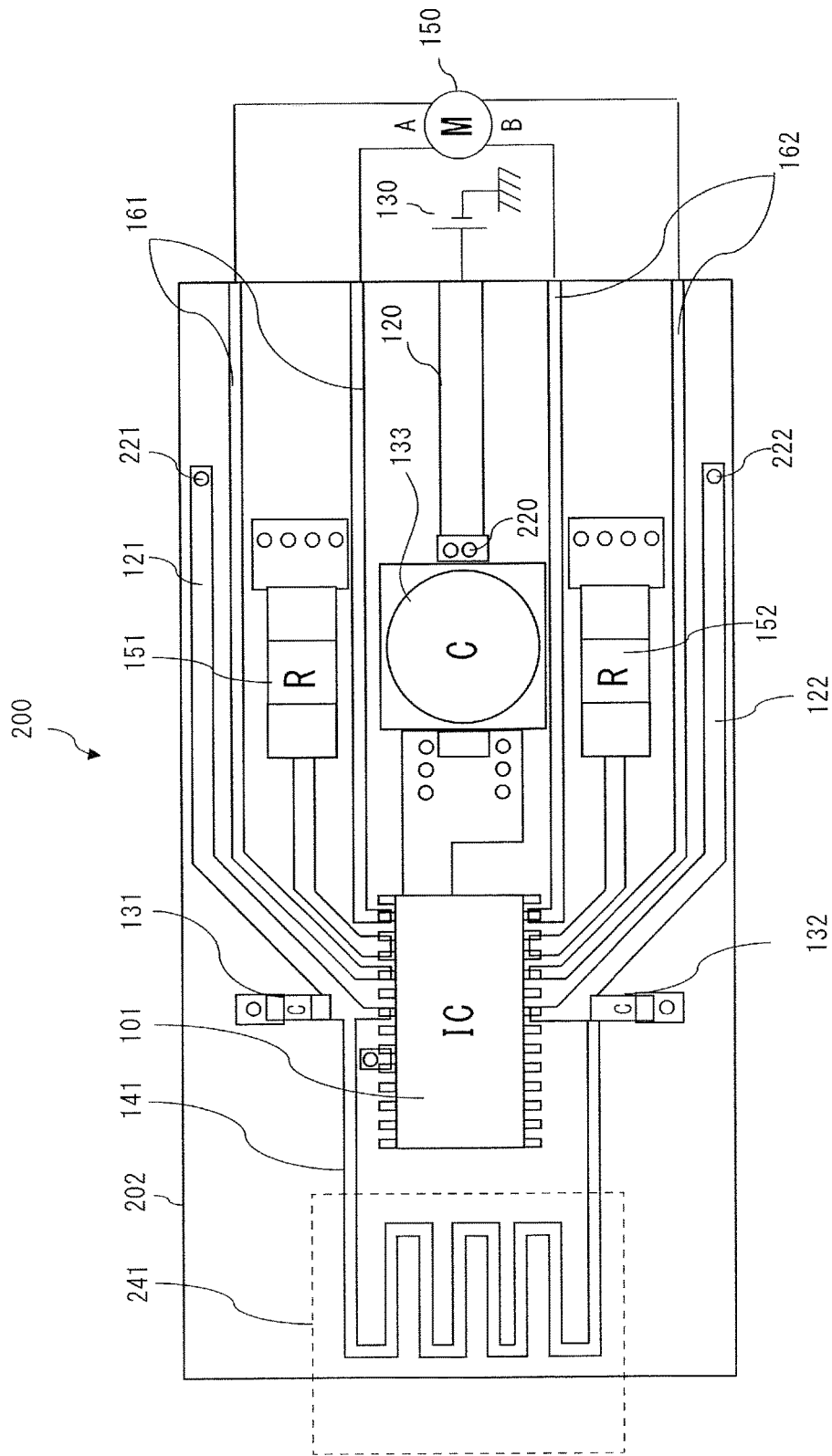
FIG. 2 is a layout of a surface side of a printed circuit board of the first embodiment.
Figure 3:
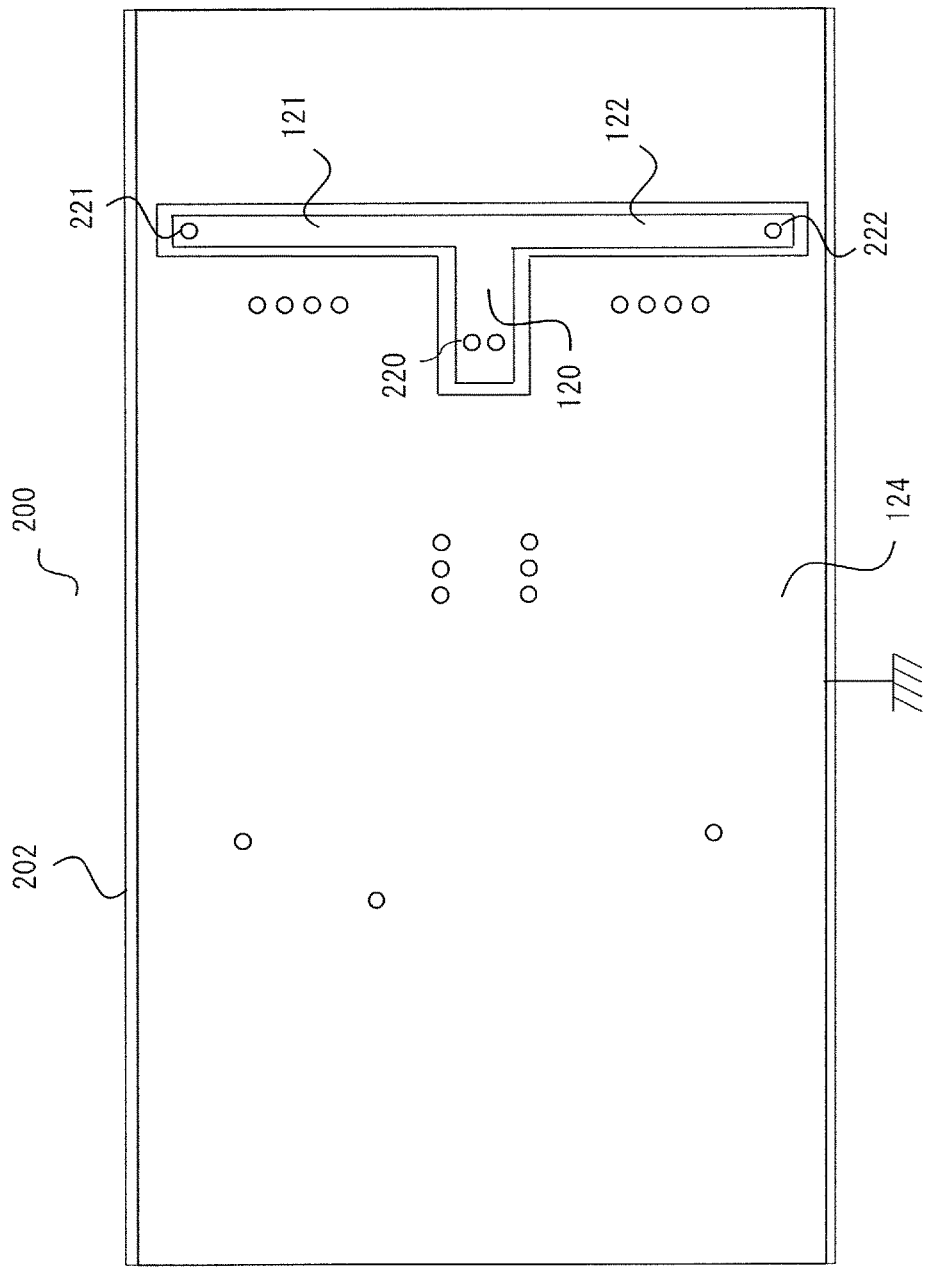
FIG. 3 is a layout of a back side of a printed circuit board of the first embodiment.

FIGS. 2 and 3 schematically illustrate the printed circuit board 200 of the present embodiment on which the power supplying circuit is mounted. FIG. 2 illustrates a surface side (face) of the printed circuit board 200, and FIG. 3 illustrates a back side (back) of the printed circuit board 200. Elements corresponding to those illustrated in the circuit diagram of FIG. 1 will be denoted by the same reference numerals with those in FIG. 1. It is noted that the 'printed circuit board' refers to a condition in which electronic parts are mounted on the printed wiring board.

The printed wiring board 202 has a two-layered wiring structures, and conductive patterns such as wires are formed on a surface and a back thereof while interposing an insulation layer. The respective parts of the driving IC 101, the capacitor 131, the capacitor 132, the electrolytic capacitor 133, the current sensing resistance 151 and the current sensing resistance 152 are mounted on the printed wiring board 202 and compose the printed circuit board 200 as a whole. It is noted that the printed wiring board is not limited to what having the two-layered substrates but may be a multi-layered structure including more conductive layers.

A hard or flexible substrate may be used for the insulation layer of the printed wiring board. While a paper phenol substrate, a paper epoxy substrate, glass composite substrate, a glass epoxy substrate, a Teflon substrate, a ceramic substrate or the like may be used for example as the hard substrate, the hard substrate is not limited to those. While polyimide or polyester films may be used for example as the flexible substrate, the flexible substrate is not limited to them.

Not only the wires but also the circuit elements such as resistors, capacitors and inductors for example may be integrally formed in the printed wiring board.

While a plurality of circular graphics exists at same spots in the printed wiring board 202 in FIGS. 2 and 3, these circular graphics indicate through-holes plated by metallic conductor such as copper and electrically connect the conductive pattern on the surface side with the conductive pattern on the back.

The printed circuit board 200 is electrically connected with the external power source 130 through terminals not illustrated.

The positive electrode of the power source 130 is connected with the positive line 120 which is a wide conductive pattern provided on the surface side of the printed wiring board 202. The positive line 120 is connected with one end of the electrolytic capacitor 133 and is connected with the conductive pattern on the back side through a through-hole 220. A part of the positive line 120 is integrated with a part of the first positive wire 121 and a part of the second positive wire 122 in the conductive pattern of the back side. The part of the first positive wire 121 on the back is connected with the first positive wire 121 on the surface side through a through-hole 221 and the part of the second positive wire 122 on the back is connected with the second positive wire 122 on the surface side through the through-hole 222.

The first positive wire 121 of the surface side is connected with the power input terminal of the switching circuit 111 of the driving IC 101 and is also electrically connected with one end of the capacitor 131 disposed in the vicinity of the power input terminal. The second positive wire 122 of the surface side is connected with the power input terminal of the switching circuit 112 of the driving IC 101 and is also electrically connected with one end of the capacitor 132 disposed in the vicinity of the power input terminal.

The negative electrode of the power source 130 is electrically connected with the negative line 124 which is a wide conductive pattern provided on the back side of the printed wiring board 202. The negative line 124 is electrically connected with the other end of the electrolytic capacitor 133, the other end of the capacitor 131, the other end of the capacitor 132, one end of the current sensing resistance 151, and one end of the current sensing resistance 152 through the through-holes. The negative line 124 which is the conductive pattern of a wide area provided on the back side of the printed wiring board 202 functions also a heat radiating conductor plane.

The two phase-A output lines 161 connected with output terminals of the switching circuit 111 of the driving IC 101 and the two phase-B output lines 162 connected with output terminals of the switching circuit 112 are disposed on the surface side of the printed wiring board and are electrically connected with the external motor 150.

The printed circuit board of the power supplying unit of the present embodiment is provided with the bypass circuit 141 connecting the first positive wire 121 with the second positive wire 122 as described with respect to the circuit diagram in FIG. 1. Specifically, as illustrated in FIG. 2, the bypass circuit 141 is formed on the surface side conductive layer of the printed wiring board 202 as a conductive layer pattern connecting the power input terminal of the switching circuit 111 with the power input terminal of the switching circuit 112. The bypass circuit 141 includes a meander shape portion 241, i.e., a meandered conductive pattern, and has inductance of 10 nH for example.

Figure 4:
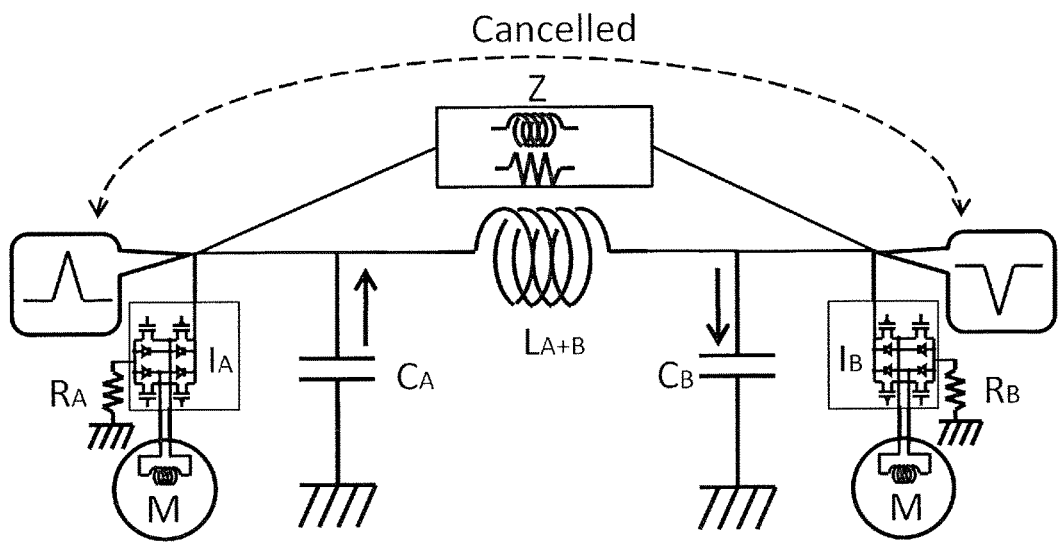
FIG. 4 is a simplified circuit diagram illustrating a principle for suppressing power supply voltage fluctuation.

Next, a principle of suppressing the source voltage fluctuation by the printed circuit board of the present embodiment will be described. FIG. 4 is a simplified circuit diagram illustrating the principle for suppressing the source voltage fluctuation of the first embodiment.

As a main part indicating the principle of the present disclosure, FIG. 4 illustrates a plurality of driving elements IA and IB, power supplying capacitors CA and CB for use in high frequency, a power supplying wire LA+B, the bypass circuit Z, the motor M and the current sensing resistances RA and RB. The driving element IA corresponds to the switching circuit for 111 for use in phase-A, and the driving element D3 corresponds to the switching circuit 112 for use in phase-B. The power supplying capacitor CA corresponds to the capacitor 131, and the power supplying capacitor CB corresponds to the capacitor 132. The power supplying wire LA+B corresponds to the first and second positive wires 121 and 122, the bypass circuit Z corresponds to the bypass circuit 141, the motor M corresponds to the motor 150, the current sensing resistor RA corresponds to the current sensing resistance 151 and the current sensing resistor RB corresponds to the current sensing resistance 152, respectively.

In a case where a current I is flown through the driving element IA to supply power to the motor M, inductive energy (L×I×I/2) is generated in the inductance of the power supplying wire LA+B. If the driving element stops the flow of the current, energy accumulated in the inductance of the power supplying wire LA+B is flown to and is accumulated in the power supplying capacitor CA.

In a case where no bypass circuit Z is provided, the accumulated energy moves from CA to CB as CA→LA+B→CB and returns from CB to CA as CB→LA+B→CA. Resonance is generated because the exchange of the energy is repeated also after that, the resonance causes the source voltage fluctuation of constant frequency, thus causing the radiated noise.

Meanwhile, the present embodiment is provided with the bypass circuit Z connecting the capacitor CA with the capacitor CB separately from the power supplying wire LA+B. In this case, the inductive energy generated in the power supplying wire LA+B is liable to be distributed to the both of CA and CB, imbalance of energy between CA and CB can be suppressed. This arrangement makes it possible to suppress the energy from reciprocating between CA and CB through LA+B and to reduce the source voltage fluctuation otherwise caused by the resonance described above. That is, it is possible to suppress the source voltage fluctuation caused by the resonance and to prevent the radiated noise caused by the source voltage fluctuation by preventing the energy from being accumulated unevenly in one power supplying capacitor.

Still further, although if the power supplying capacitor is disposed closer to the driving element, the resonance described above is liable to be generated more, the present disclosure permits to dispose the power supplying capacitor in the vicinity of the driving element because the radiated noise caused by the resonance can be suppressed by providing the bypass circuit. Therefore, it is possible to supply power following high-speed operations also in driving the driving element fast and to realize efficient power supply to a load. That is, it is possible to rotate the motor smoothly with desirable rotational speed.

Still further, according to the present embodiment, it is possible to suppress the radiated noise from being generated by the source voltage fluctuation without increasing a cost of the printed circuit board by composing the bypass circuit only by the conductive pattern of the printed wiring board.

According to the present embodiment, as illustrated in FIGS. 2 and 3, the first positive wire 121 connected to the power input terminal of the switching circuit 111 and the second positive wire 122 connected to the power input terminal of the switching circuit 112 are disposed approximately symmetrically with respect to the driving IC 101. That is, the shapes of the surface side conductive pattern and the back side conductive pattern, and the disposition of through-holes 221 and 222 of the printed wiring board 202 are approximately symmetrical with respect to the driving IC 101. That is, the conductive patterns of the first and second positive wires 121 and 122 are formed such that sectional structures and lengths thereof are equal aside from production errors.

According to the present embodiment, the power supplying capacitors 131 and 132 are also designed to have equal capacitance aside from production errors.

It is possible to substantially eliminate a difference of electrical characteristics of the positive wires of the power supply connected to the respective power source terminals by forming and disposing the components symmetrically. Accordingly, because no imbalance of supply of power occurs in each phase depending on the frequency and the power can be supplied equally in each phase, it is possible to stably operate the motor 150.

Here, advantageous effects brought about by the present embodiment will be described further from an aspect of resonance characteristics of the LC circuit. In a case where there is no bypass circuit, the power supplying capacitor 131 is connected with the power supplying capacitor 132 through the first and second positive wires 121 and 122, composing a LC circuit in which the both positive wires are used as inductance in a high-frequency range.

Meanwhile, a circuit connecting from the power supplying capacitor 131 to the electrolytic capacitor 133 by using the first positive wire 121 as inductance also composes a LC circuit.

While the former LC circuit has resonance frequency determined by the two power supplying capacitors 131 and 132 and the two positive wires 121 and 122, they are configured such that the capacitances of the capacitors 131 and 132 are equal and the inductances of the two positive wires are equal.

Meanwhile, because the latter LC circuit is set such that electrostatic capacitance of the electrolytic capacitor 133 is normally fully greater than that of the power supplying capacitor 131, the latter LC circuit has resonance frequency determined by the capacitance C of the power supplying capacitor 131 and L of the first positive wire 121.

Accordingly, the both former and latter LC circuits have resonance frequency of $f=1/2\pi\sqrt{LC}$. Still further, because the LC circuit composed of the capacitor 132 and the second positive wire 122 connected to the capacitor 132 and the electrolytic capacitor 133 has equal resonance frequency, all resonance frequencies within the driving circuit coincide, generating a large source voltage fluctuation, i.e., power supply resonance. That is, although it is possible to stably operate the motor 150 because power can be supplied fast to the motor 150, it is a circuit liable to generate radiated noise.

The present embodiment efficiently suppresses the power supply resonance by providing the bypass circuit 141 in the circuit liable to generate the radiated noise even though it enables the stable operation as described above.

Figure 5:
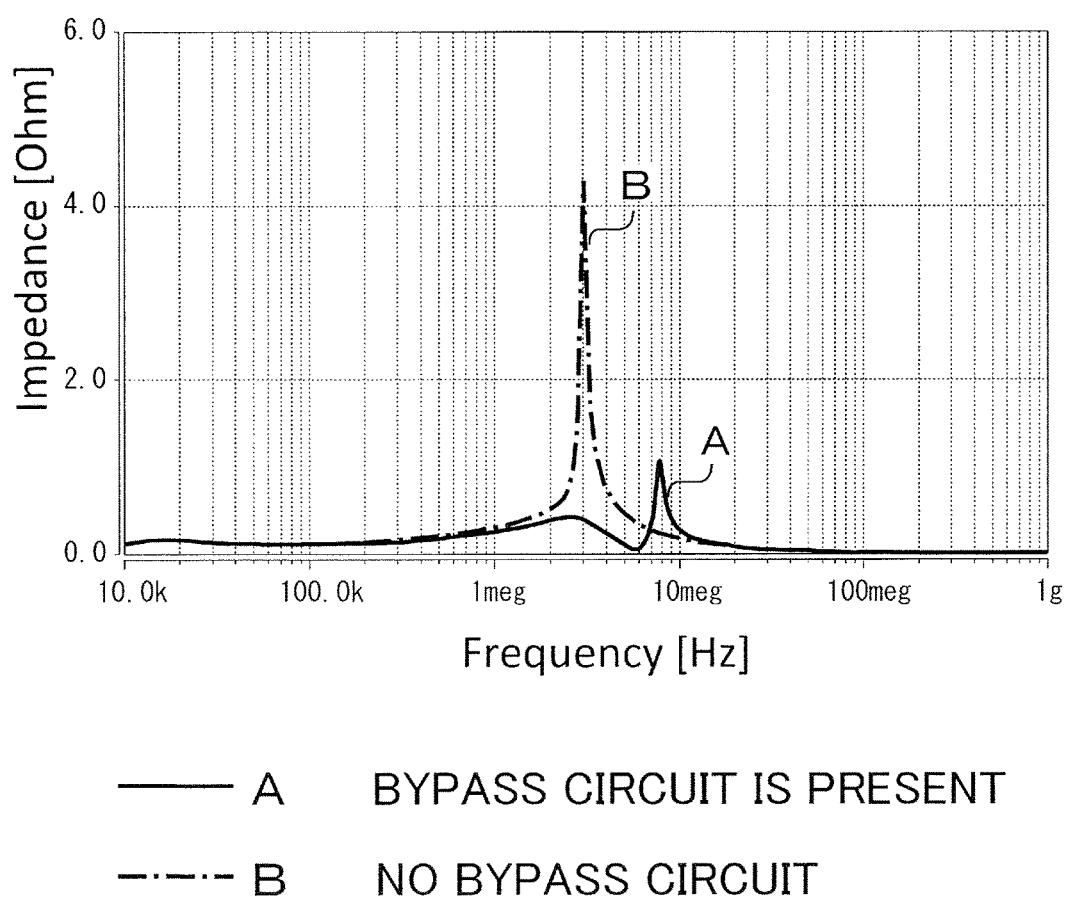
FIG. 5 is a graph indicating differences of impedance-frequency characteristics depending on whether or not a bypass circuit is present.

FIG. 5 is a graph indicating a difference of impedance frequency characteristics depending on whether or not the bypass circuit is present. An axis of ordinate indicates impedance and an axis of abscissa indicates frequency.

In a case where there is no bypass circuit, the LC circuit composed of the inductance L of the positive wire of the power supply and the capacitance C of the power supplying capacitor has a single resonance frequency of $f=1/2\pi\sqrt{LC}$, and a resonance peak of sharp impedance as indicated by a dash-dotted line appears in the graph.

Meanwhile, in a case where inductance (10 nH in FIG. 5) caused by the bypass circuit is included, a LC circuit composed of the inductance Lz of the bypass circuit and the capacitance C of the power supplying capacitor is also formed in addition to the abovementioned LC circuit. Therefore, there exist a plurality of resonance frequencies and it can be seen that magnitude of the resonance peak is reduced as compared to the case where there is no bypass circuit and there exists only the single resonance frequency.

By the way, while the impedance of the bypass circuit 141 is desirable to be low in order to suppress the abovementioned resonance, supplies of power in phase-A and phase-B are liable to interfere with each other on the order hand if the impedance is low.

Figure 6:
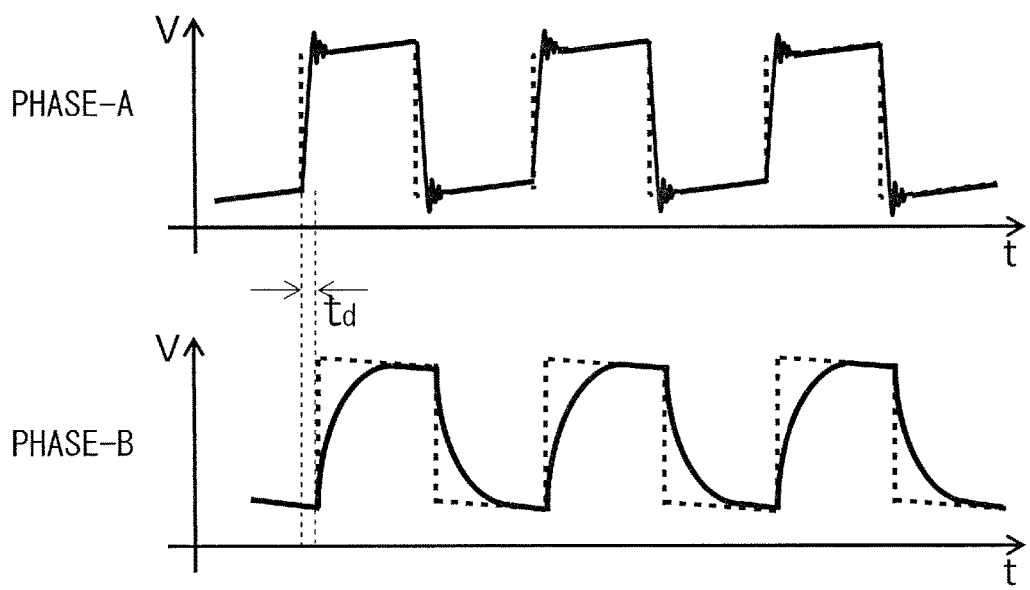
FIG. 6 illustrates waveform charts of motor driving voltage.

Then, a design guideline of the impedance of the bypass circuit 141 will be described by making reference to a waveform chart of motor driving voltages indicated in FIG. 6. In a case where a phase-B waveform is outputted by being delayed by a phase difference td from a phase-A waveform, the power supplying capacitor on the phase-B supplies power first to the phase-A side. Then, while it is necessary to supply power to the phase-B side after td, accumulation of electric charge in the capacitor on the phase-B side is insufficient because the power has been supplied to the phase-A side if the impedance of the bypass circuit 141 is low. Then, the power cannot be fully supplied to the phase-B side and a waveform of current of the phase-B becomes dull as indicated by a solid line in the graph in FIG. 6, causing a problem that the operation of the motor is unstabilized due to the difference of the waveforms of the phase-A and the phase-B.

Then, the impedance of the bypass circuit is set as follows.

At first, a case where power is supplied from the B-phase power supplying capacitor to the phase-A driving element through the bypass circuit will be considered. In such a case, the following equation holds if such a case is considered to be a discharge phenomenon of a ZC series circuit, where Z is the impedance of the bypass circuit, C is capacitance of the phase-B power supplying capacitor and V is voltage applied to the phase-B power supplying capacitor.

$$V(t) = V \times e^{-\frac{t}{ZC}} \qquad \text{Eq. 1}$$

The following equation 2 is obtained by rearranging the equation 1.

$$ZC = -\frac{t}{\ln\left(\frac{V(t)}{V}\right)} \qquad \text{Eq. 2}$$

Here, a transition time Tsw of the switching circuit of the phase-A driving element is defined as a time required for voltage of the phase-A output line 161 to change from 10% of maximum amplitude to 90%. Then, it is necessary to arrange such that power is not supplied too much from the capacitor on the phase-B side and electric charge of the capacitor on the phase-B side is not discharged too much during the transition time Tsw. Then, an arrangement is made such that a leading waveform of capacitor on the phase-B side does not become too dull by setting such that the electric charge of the capacitor on the phase-B side is not discharged too much by suppressing a rate of electric charge discharged from the capacitor on the phase-B side is 50% or less in supplying power to the phase-A side. That is, setting is made so as to fulfill a relationship expressed by the following equation, where Z is the impedance of the bypass circuit.

$$\frac{1.4 \times T_{sw}}{C} \leq Z \qquad \text{Eq. 3}$$

It is noted that in a case where the phase difference td of the phase-A and the phase-B is greater than the transition time Tsw, the impedance of the bypass circuit may be set by a numerical value smaller than a numerical range expressed by the equation 3 by prioritizing the reduction of the source voltage fluctuation.

The similar method may be applied also to a case where power is supplied from the phase-A power supplying capacitor to the phase-B driving element through the bypass circuit Z.

It is noted that while the bypass circuit is what connects the two capacitors for use in power supply, it is desirable to be a resistor or an inductor, or both of the resistor and the inductor, and no series capacitor is provided within the circuit.

As described above, according to the present embodiment, it is possible to effectively suppress the radiated noise from being generated and to supply power fast to the load in the power converter provided with the plurality of power converting units which control the supply of power to the load by switching the driving element.

It is noted that while voltage is supplied to the respective power source terminals of the driving IC 101 by the first and second positive wires 121 and 122 branched symmetrically from the positive line 120 serving as the positive trunk line in the present embodiment, the present embodiment of the present disclosure is not limited to such a case. For instance, it is also possible to obtain an effect of suppressing the radiated noise from being generated by adding the bypass circuit even in a case where positive wires are branched asymmetrically.

Second Embodiment

Figure 7:
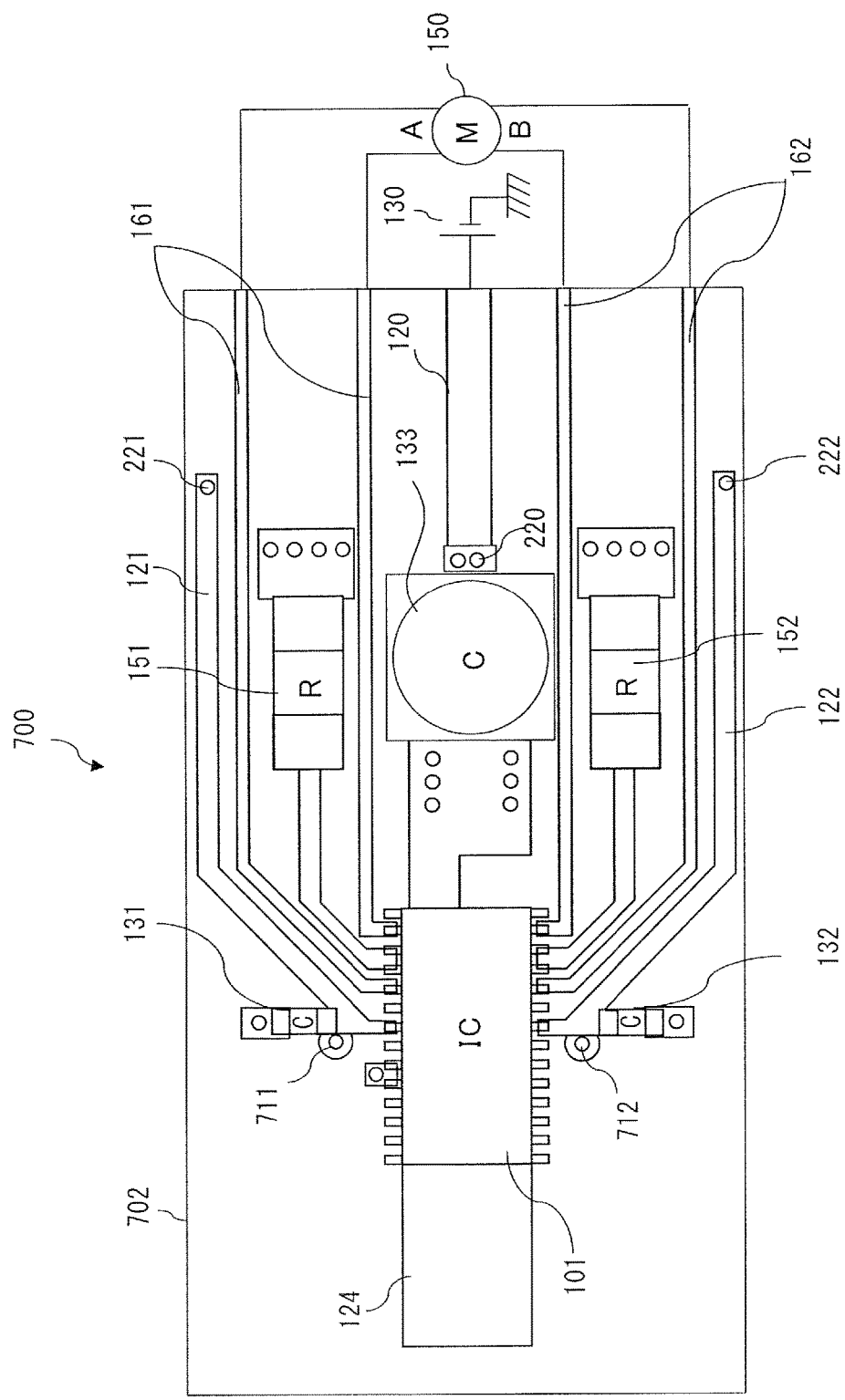
FIG. 7 is a layout of a surface side of a printed circuit board of a second embodiment.
Figure 8:
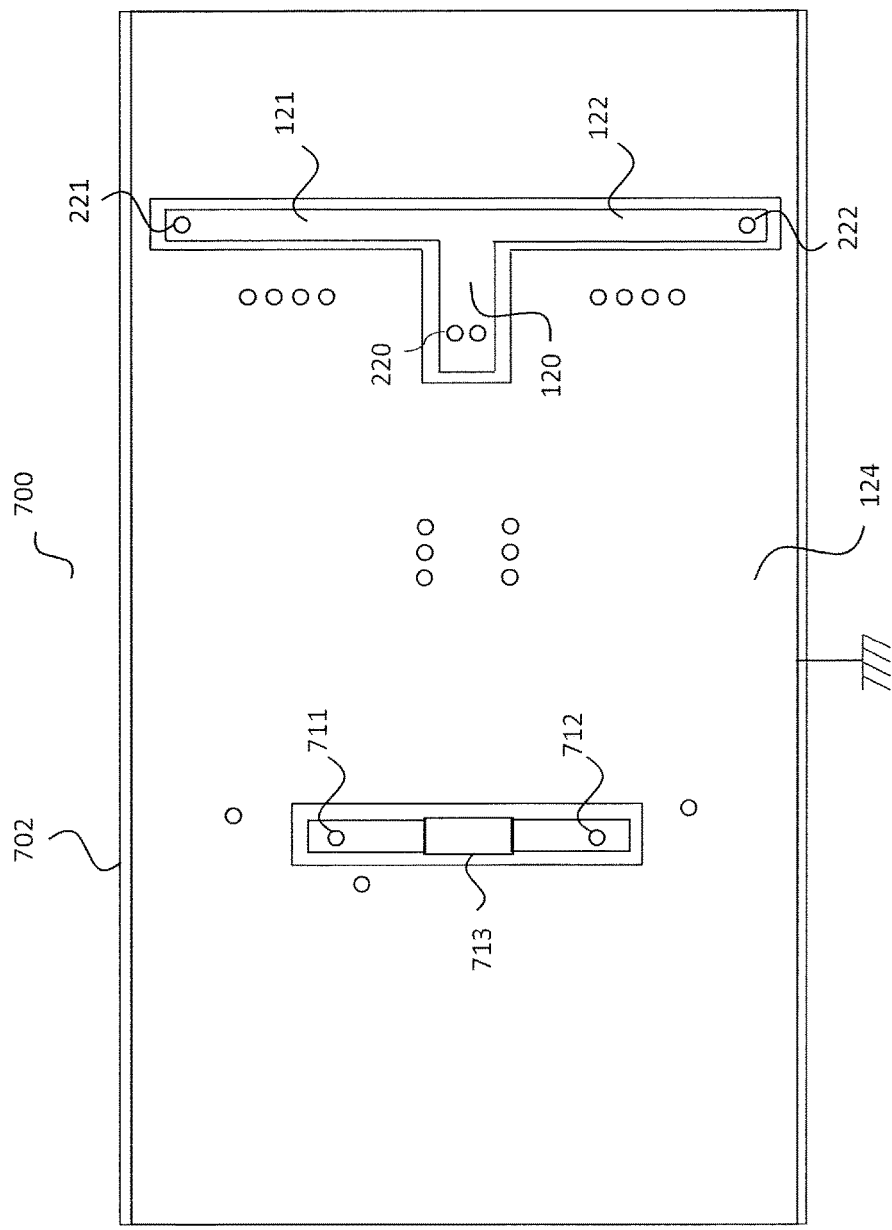
FIG. 8 is a layout of a back side of the printed circuit board of the second embodiment.

While the bypass circuit of the first embodiment has been formed only by the conductive layer pattern of the printed wiring board, a second embodiment is different from the first embodiment in that the bypass circuit is composed while including a chip-type element and that the negative line 124 of the driving IC 101 is disposed widely on the surface side, i.e., the surface, of the printed wiring board. FIGS. 7 and 8 are circuit diagrams schematically illustrating a printed circuit board of a power supplying unit of the present embodiment. FIG. 7 illustrates a surface side, i.e., a surface, of the printed circuit board 700, and FIG. 8 illustrates a back side, i.e., a back, of the printed circuit board 700. It is noted that similarly to the first embodiment, the printed circuit board 700 refers to a printed wiring board 702 on which electronic parts are mounted in the following description. While the same elements with those of the first embodiment are denoted by the same reference numerals in FIGS. 7 and 8, their description will be omitted here.

In the second embodiment, a chip-type element 713 is mounted on a part of the bypass circuit connecting the power source terminals of the driving IC 101 in the printed circuit board 700. As illustrated in FIGS. 7 and 8, through-holes 711 and 712 are provided in vicinities of the respective power input terminals of the driving IC 101 so as to communicate with the back side, and both ends of the chip-type element 713 are connected with the thorough holes by a conductive pattern, i.e., a conductive path, provided on the back side. Characteristics of the conductive pattern and the chip-type element 713 are appropriately selected such that the bypass circuit fulfills the aforementioned equation 3.

It is also possible by the present embodiment to effectively suppress the radiated noise from being generated and to supply power fast to the load from the power converter provided with the plurality of power converting units which control the supply of power to the load by switching the driving elements.

Although it is easy to form the bypass circuit only by the conductive pattern on the printed wiring board like the first embodiment, a large area is occupied by the meander shape, and a range of impedance that can be realized by the conductive pattern is limited.

In contrary to that, according to the present embodiment, it is possible to form the bypass circuit between the power source terminals even in a case where there is no room to form a large conductive pattern around the driving IC and to downsize the printed circuit board because the chip-type element is used and an impedance selectable range is wide.

Third Embodiment

Figure 9:
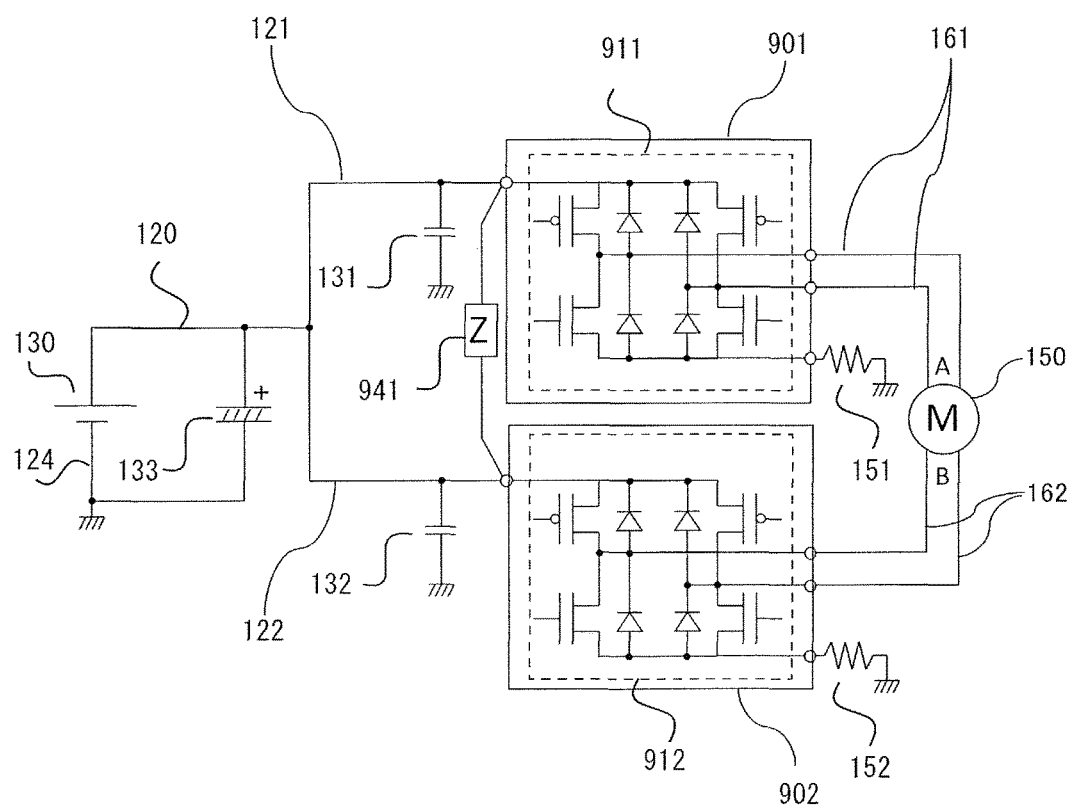
FIG. 9 is a circuit diagram of a third embodiment.

FIG. 9 is a circuit diagram of a power supplying unit of a third embodiment of the present disclosure. The same elements with those described in the first embodiment will be denoted by the same reference numerals, and their description will be omitted here. A circuit of the present embodiment is also configured as a printed circuit board by a printed wiring board and electronic parts mounted thereon.

While the switching circuit 111 for use in phase-A and the switching circuit 112 for use in phase-B are incorporated in the single driving IC 101 in the first embodiment, the present embodiment is different from the first embodiment in that a switching circuit for use in phase-A 911 and a switching circuit for use in phase-B 912 are divided into different IC chips. That is, according to the present embodiment, a driving circuit 901 for use in phase-A and a driving circuit 902 for use in phase-B are provided separately in order to intermittently supply power to the motor 150 that operate in two phases of the phase-A and the phase-B.

According to the present embodiment, a bypass circuit 941 electrically connects a power source terminal of the driving circuit 901 for use in phase-A with a power source terminal of the driving circuit 902 for use in phase-B.

The configuration of the present embodiment makes it possible to prevent energy from being accumulated unevenly by one power supplying capacitor, to suppress a source voltage fluctuation otherwise produced by the uneven energy accumulation and to prevent radiated noise from being generated in a case where separate driving ICs are used per each phase from an aspect of distributing heat generation.

Still further, because the present embodiment makes it possible to prevent the radiated noise, the power supplying capacitors can be disposed in the vicinities of the power input terminals of the respective driving ICs. Therefore, it is possible to supply power following operations of the load even in driving the load fast, thus realizing the fast supply of power to the load. That is, it is possible to rotate the motor smoothly with desirable rotational speed.

It is noted that the bypass circuit 941 may be formed only by the conductive layer pattern on the printed wiring board like the first embodiment or may be configured so as to include the chip-type element like the second embodiment.

Fourth Embodiment

Figure 10:
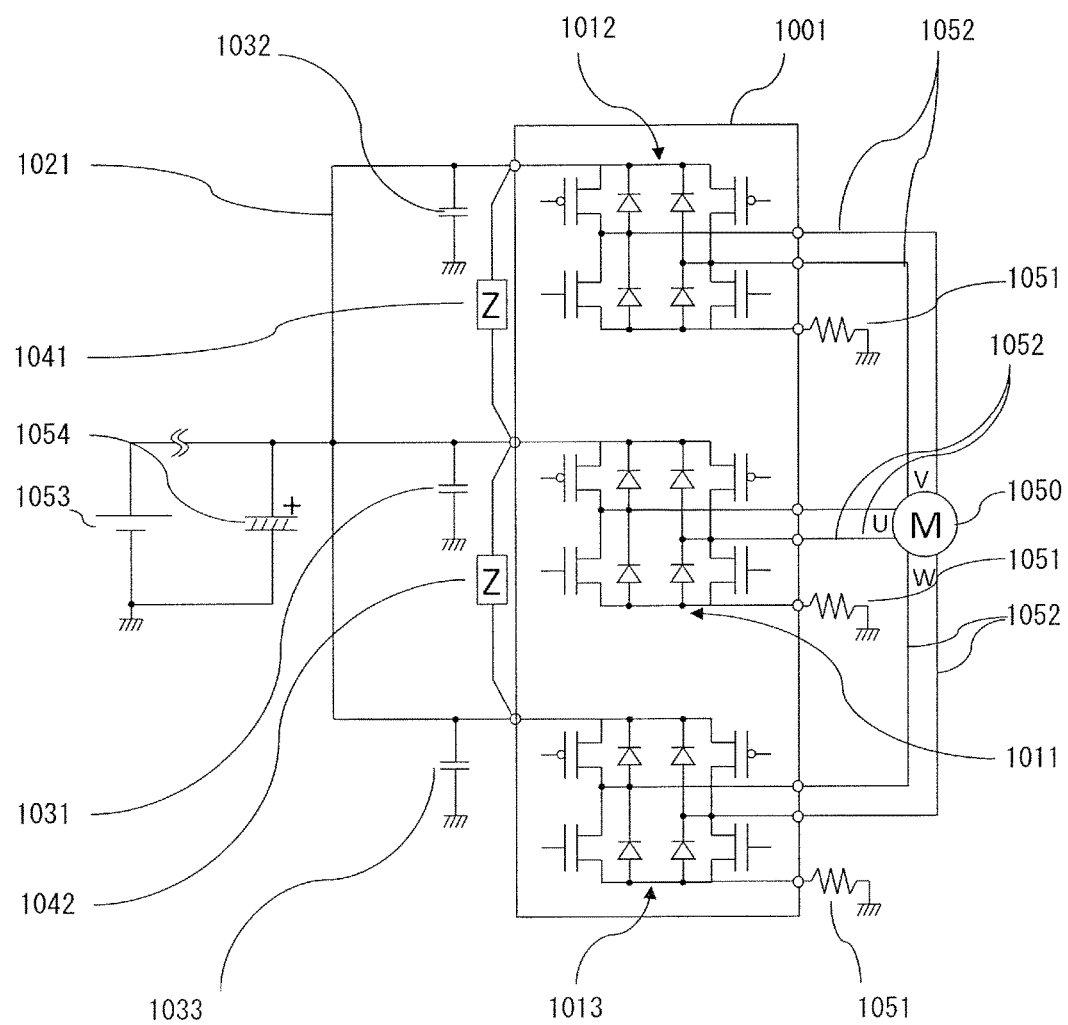
FIG. 10 is a circuit diagram of a power supplying unit of a fourth embodiment.

FIG. 10 is a circuit diagram of a power supplying unit of a fourth embodiment. The circuit diagram of the present embodiment is also configured as a printed circuit board by a printed wiring board and electronic parts mounted thereon.

According to the present embodiment, a driving IC 1001 includes driving elements 1011, 1012 and 1013 for intermittently supplying power to a motor 1050 operative in three-phases of phase-U, phase-V, and phase-W through a motor driving line 1052. One ends of the driving elements are connected with the power source and other ends are connected to the ground through current sensing resistors 1051. The power input terminals of the driving elements have separate terminals respectively in three phases in order to supply enough power to the motor and are electrically connected to a power source 1053 through a positive wire 1021. An electrolytic capacitor 1054 for supplying low-frequency power and capacitors 1031, 1032 and 1033 for supplying high-frequency power are disposed in the positive wire 1021. According to the present embodiment, a bypass circuit 1041 is disposed between the power input terminals of the phase-U and the phase-V and a bypass circuit 1042 is disposed between the power input terminals of the phase-V and the phase-W.

The present embodiment makes it possible to prevent energy from being unevenly accumulated in the power supply capacitors between the phase-U and phase-V power input terminals and between the phase-V and phase-W power input terminals and to suppress the source voltage fluctuation and radiated noise by resonance by providing the bypass circuits 1041 and 1042.

Still further, because the present embodiment makes it possible to prevent the radiated noise, the power supplying capacitors can be disposed in the vicinities of the respective power input terminals of the driving IC. Therefore, it is possible to supply power following operations of the load also even in driving the load fast, thus realizing fast supply of power to the load. That is, it is possible to rotate the motor smoothly with desirable rotational speed.

It is noted that the bypass circuits 1041 and 1042 may be formed only by the conductive layer patterns on the printed wiring board like the first embodiment or may be configured so as to include the chip-type element like the second embodiment.

Fifth Embodiment

Figure 11:
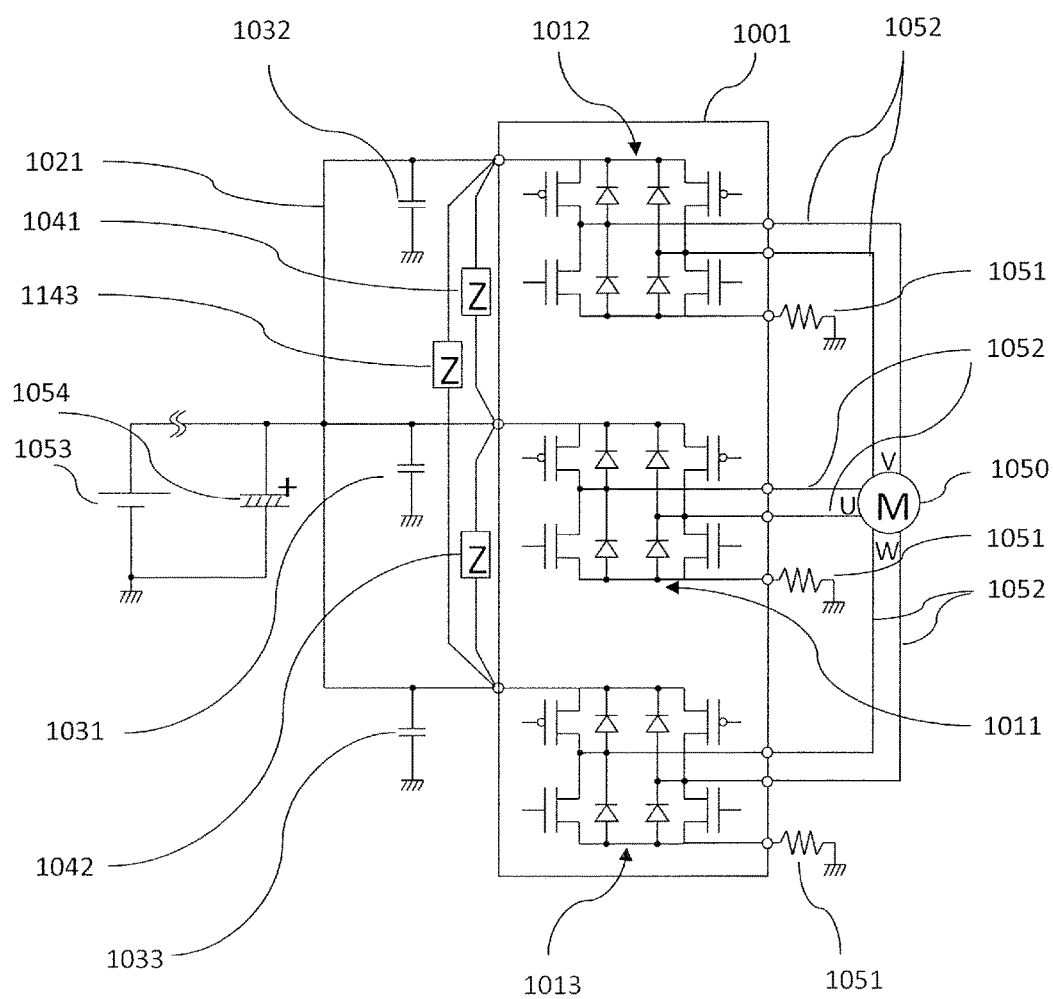
FIG. 11 is a circuit diagram of a power supplying unit of a fifth embodiment.

FIG. 11 is a circuit diagram of a power supplying unit of a fifth embodiment of the present disclosure. A circuit of the present embodiment is also configured as a printed circuit board by a printed wiring board and electronic parts mounted thereon. While a circuit configuration of the present embodiment is similar to that of the fourth embodiment illustrated in FIG. 10, it is different in that a bypass circuit 1143 is provided also between the phase-U and phase-W power input terminals in addition to the bypass circuits 1041 and 1042 between the phase-U and phase-V power input terminals and between the phase-V and phase-W power input terminals.

The present embodiment makes it possible to prevent energy from being unevenly accumulated in the power supplying capacitors between the phase-U and the phase-V, between the phase-V and the phase-W and between the phase-U and the phase-W and to suppress the source voltage fluctuation and radiated noise from being generated by resonance by providing the bypass circuits 1041, 1042 and 1143.

Still further, because the present embodiment makes it possible to prevent the radiated noise, the power supplying capacitors can be disposed in the vicinities of the respective power input terminals of the driving IC. Therefore, it is possible to supply power following operations of the load even in driving the load fast, thus realizing fast supply of power to the load. That is, it is possible to rotate the motor smoothly with desirable rotational speed.

It is noted that the bypass circuits 1041, 1042 and 1143 may be formed only by the conductive layer patterns on the printed wiring board like the first embodiment or may be configured so as to include the chip-type element like the second embodiment.

Sixth Embodiment

The bypass circuit 141 of the first embodiment illustrated in FIG. 2 is disposed on a side (left side) opposite from the motor to which the driving IC 101 is connected on the surface side, i.e., the surface, of the printed wiring board 202. In a case where a heat generation quantity of the driving IC 101 is large, it is desirable to dispose the negative line 124 that functions as a heat radiating conductor plane on the printed wiring board 202 as illustrated in FIG. 2 not only on the back side but also on the surface side of the printed wiring board 202 widely as illustrated in FIG. 7 for example. However, even if the negative line (referred to also as a 'conductor plane' hereinafter) is tried to be extended to the left side of the driving IC 101 as illustrated in FIG. 2, there is a case where an extension part of the negative line 124 is divided or the extension is obstructed by the bypass circuit 141. Therefore, there is a case where heat radiation of the driving IC 101 cannot be enhanced. Exemplary configurations for enhancing the heat radiation will be described below.

Figure 13:
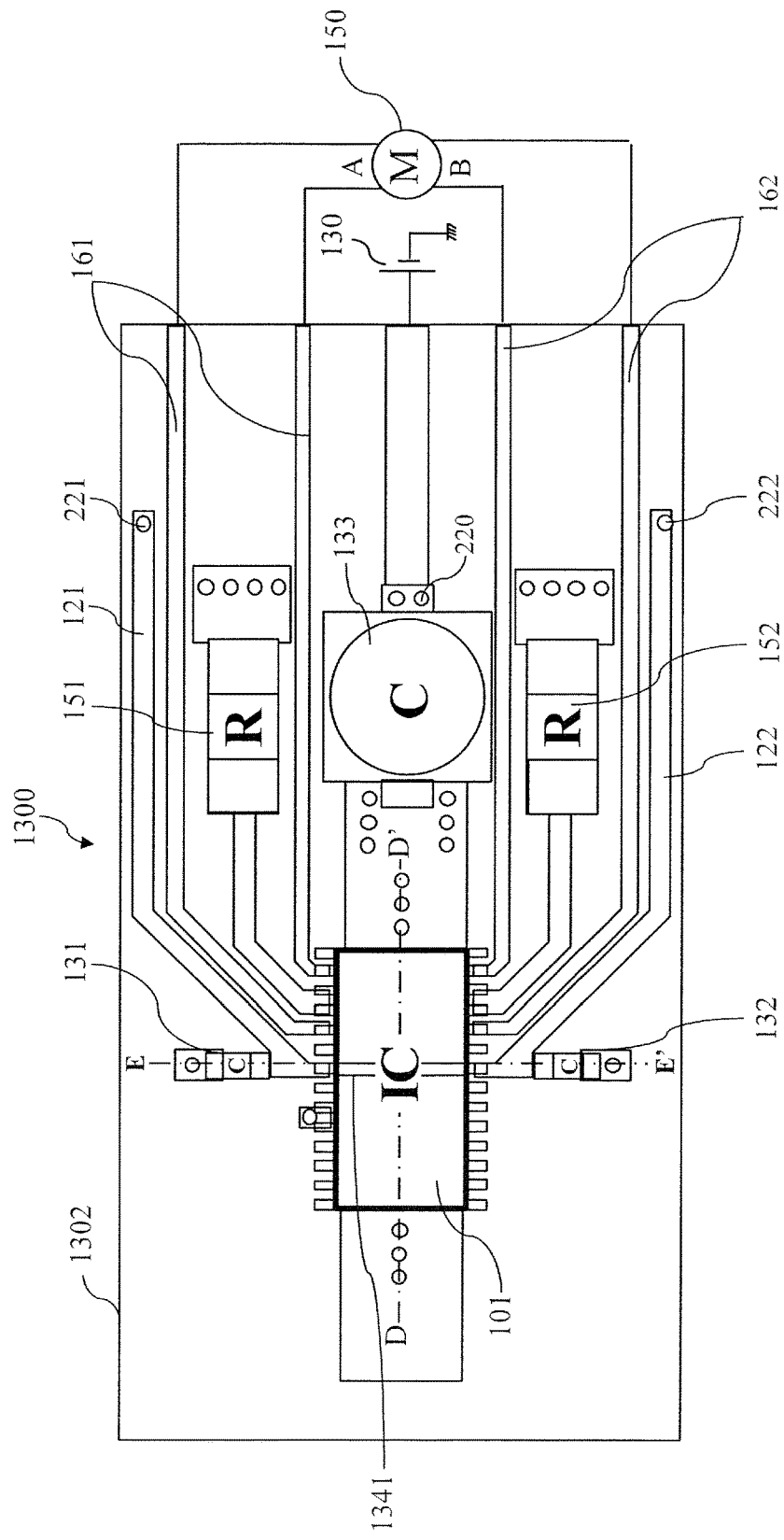
FIG. 13 is a layout of a surface side of a printed circuit board of a sixth embodiment.
Figure 14:
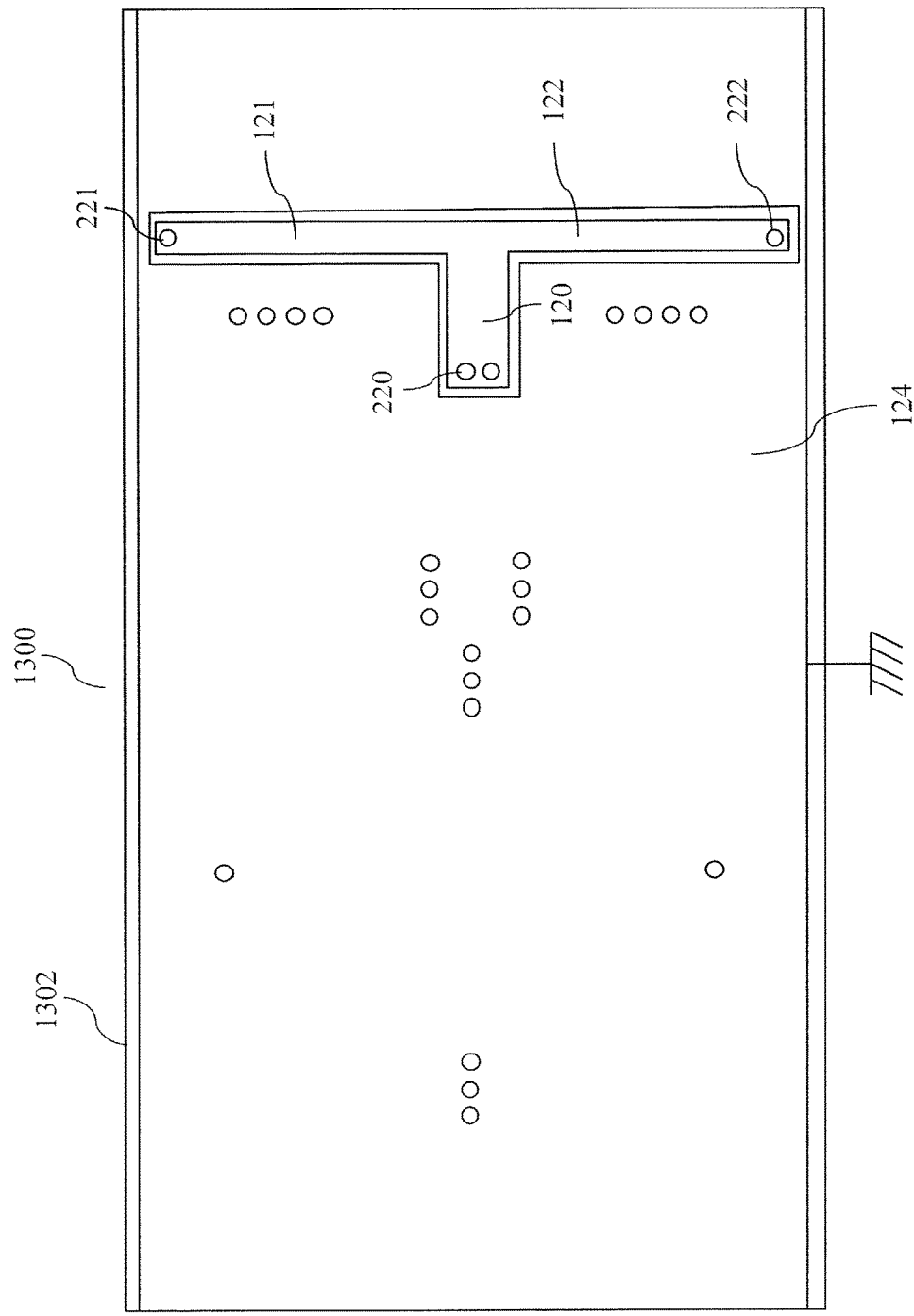
FIG. 14 is a layout of a back side of the printed circuit board of a sixth embodiment.
Figure 15:
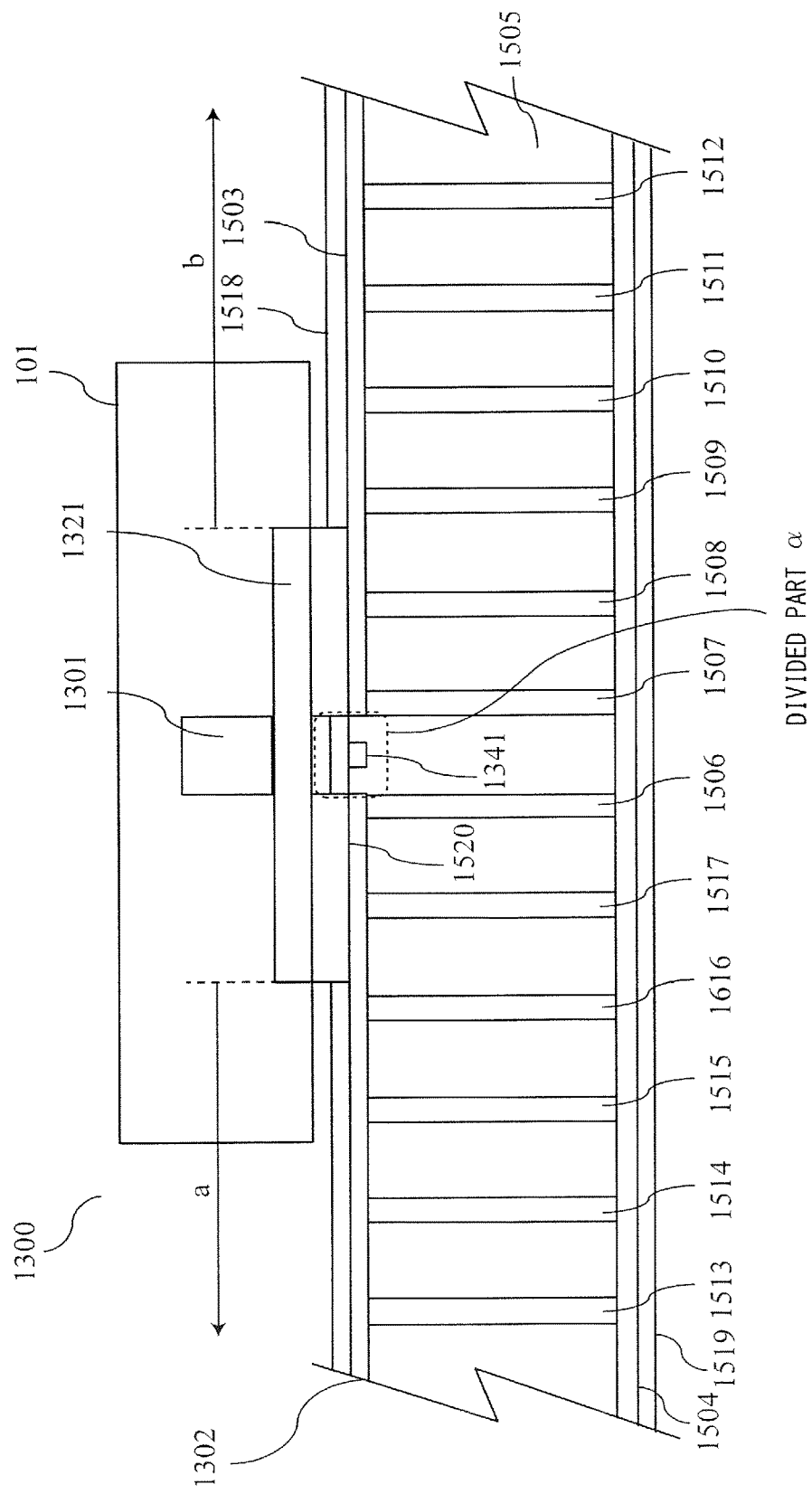
FIG. 15 is a section view of the printed circuit board of the sixth embodiment taken along a line D-D' in FIG. 13.

FIGS. 13 and 14 are layout diagrams of the surface side, i.e., the surface, and the back side, i.e., the back, of the printed circuit board of the sixth embodiment. FIG. 15 is a section view of the printed circuit board taken along a part D-D' in FIG. 13. The driving IC 101 includes an IC chip 1301 disposed at a center area and a heat sink 1321. The heat sink 1321 is a member for accelerating the heat radiation by transferring heat generated in the IC chip 1301 to the printed wiring board 1302. A two-layered printed wiring board is exemplified as the printed wiring board 1302. In order to enhance the heat radiation of the heat generated in the driving IC 101, the printed wiring board 1302 is provided with a conductor plane 1503 in a region including a region facing the heat sink 1321 and wider than the facing region on the surface of a side on which the driving IC 101 is mounted, i.e., the surface. Still further, a conductor plane 1504 is disposed while interposing an insulator 1505 on the back side opposite to the surface of the printed wiring board 1302, and the conductor plane 1503 is connected with the conductor plane 1504 through through-holes 1506 through 1517. This arrangement makes it possible to transfer the heat of the IC chip 1301 not only to the conductor plane 1503 on the surface of the printed wiring board 1302 but also to the conductor plane 1504 on the back, thus enabling to efficiently radiate the heat. A bypass circuit 1341 configured by the conductive pattern on the surface side of the printed wiring board 1302 is disposed right under the heat sink 1321 of the driving IC 101. The printed wiring board 1302 is provided with solder resists 1518 and 1519 as outermost layers to protect and to insulate the circuit. The driving IC 101 is connected with the printed wiring board 1302 through a conductive material, i.e., a heat conductive material 1520 such as solder.

According to the present embodiment, as illustrated in FIG. 15, the heat sink 1321 is disposed extending over the bypass circuit 1341 and dividing the conductor plane 1503 into regions a and b. This arrangement makes it possible to effectively suppress the radiated noise from being generated and to supply power fast to the load. Still further, because wires are disposed without bypassing the driving IC 101, the printed circuit board can be downsized. Still further, even if the conductor plane 1503 is divided into the regions a and b, the heat radiation of the driving IC 101 is enhanced because heat dissipating paths for transferring the heat generated in the IC chip 1301 to each of the regions a and b of the conductor plane 1503 through the heat sink 1321 and the conductive material 1520 are assured.

Figure 16:
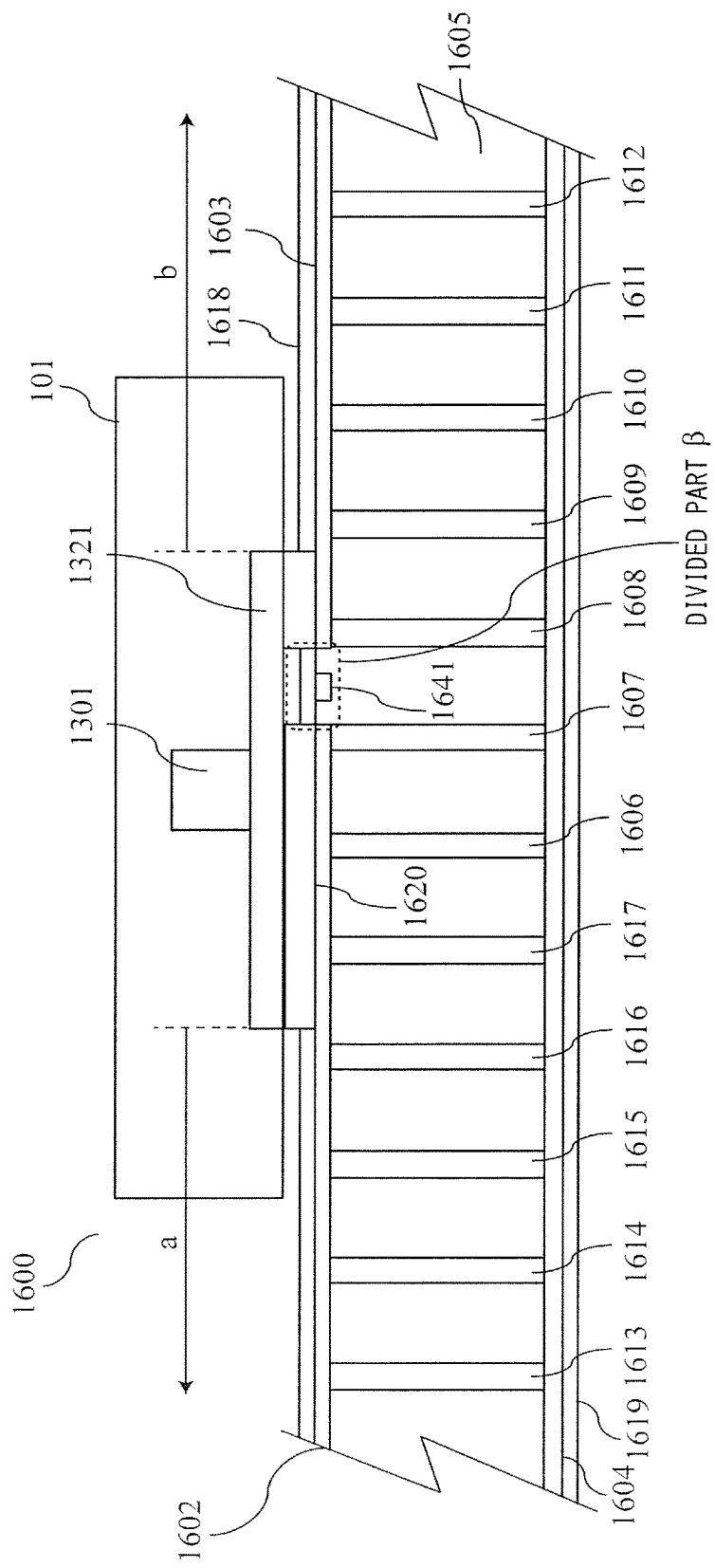
FIG. 16 is a section view of a printed circuit board of a modified example of the sixth embodiment.

FIG. 16 is a section view of a printed circuit board of a modified example of the sixth embodiment and is different from the printed circuit board in FIG. 15 in terms of disposition of the bypass circuit. Specifically, the printed circuit board in FIG. 15 has been described in the case where the bypass circuit 1341 is disposed right under the center of the IC chip 1301, a bypass circuit 1641 is disposed on a right side of the IC chip 1301, i.e., at a position not right under the center of the IC chip 1301, when viewed in front of the drawing in the printed circuit board in FIG. 16. However, in the case where routes for radiating the heat generated in the IC chip 1301 by transferring to the regions a and b of a conductor plane 1603, respectively, through the heat sink 1321 and the conductive material 1620 are assured, only the heat sink 1321 becomes the heat dissipating path through which the heat generated in the IC chip 1301 is transferred through the conductive material 1620. Accordingly, although thermal resistance increases and the heat radiation becomes inferior more or less, generally the heat sink 1321 has low thermal resistance because it is formed by a material whose thermal conductivity exceeds 300 W/mK, and an enough heat radiating effect can be obtained by this configuration.

Figure 17:
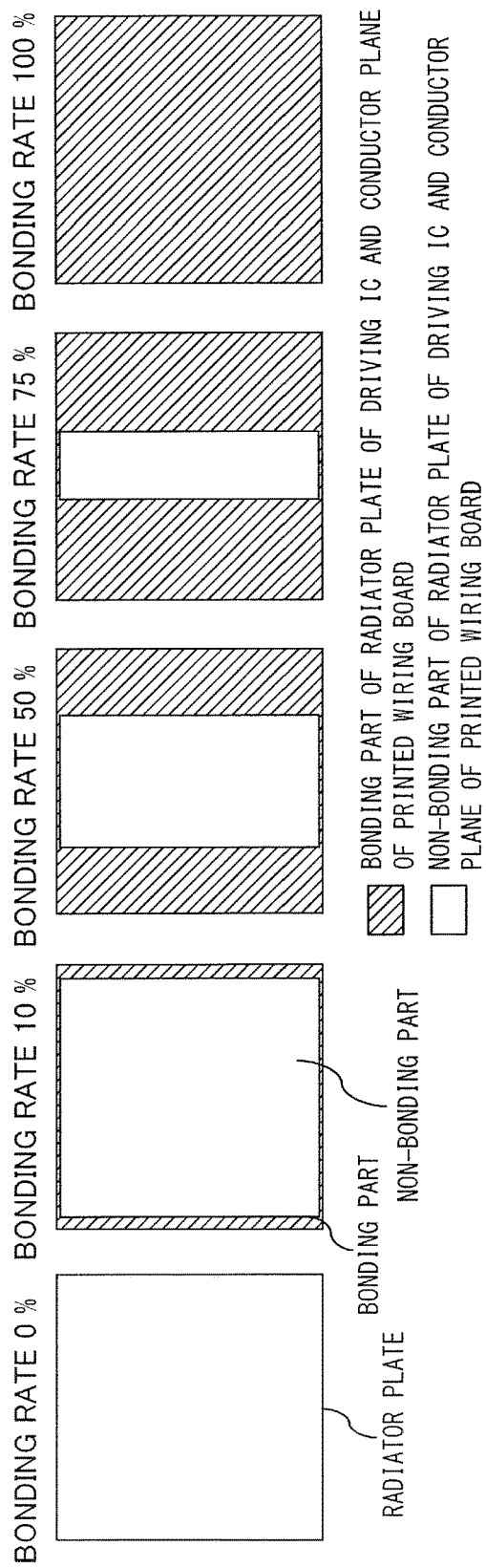
FIG. 17 is a schematic diagram illustrating parts where a heat sink of a driving IC is bonded with a conductive plane of a printed wiring board of the sixth embodiment.

FIG. 17 illustrates states in which a connection area of the radiator plane 1321 with the conductor plane 1503 is changed in a case where both ends of the heat sink 1321 are connected with the conductor plane 1503 by the conductive material 1520 to radiate heat. A bonding rate is expressed in terms of area ratio by setting such that a case where all of the heat sink 1321, in terms of an area thereof, is ideally bonded with the conductor plane 1503 of the printed wiring board is set as 100%, and a case where they are not bonded at all is set as 0%. Shaded areas in FIG. 17 indicate bond portions of the heat sink 1321 of the driving IC 101 and the conductor plane 1502 of the printed wiring board 1302. White areas in FIG. 17 indicate portions where the heat sink 1321 of the driving IC 101 is not bonded with the conductor plane 1502 of the printed wiring board 1302 to pass through the bypass circuit 1341.

Figure 18:
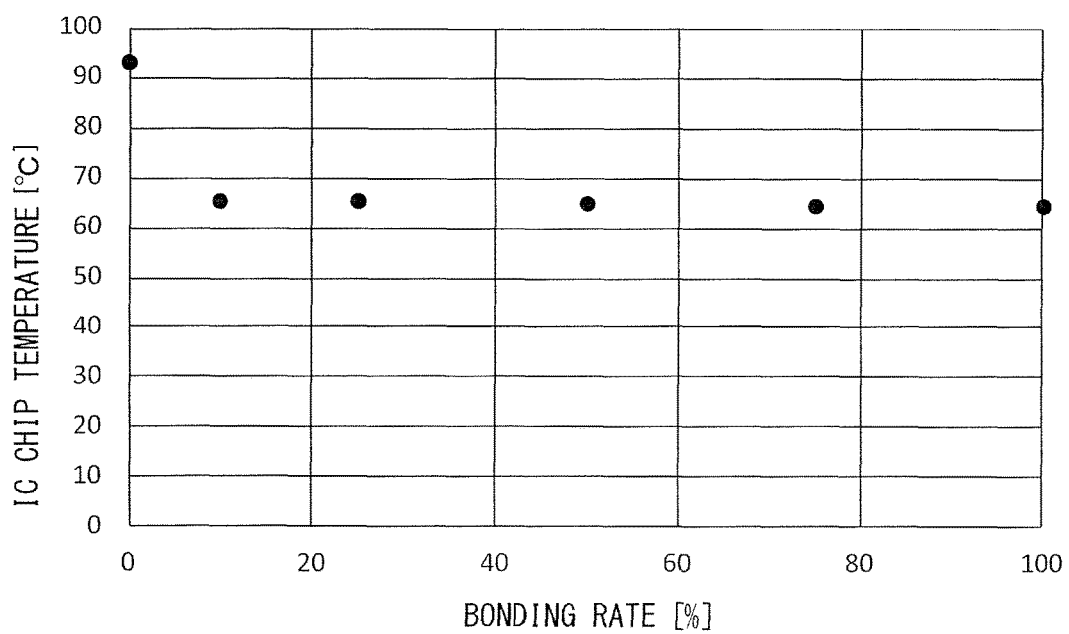
FIG. 18 is a graph indicating a relationship between a solder bonding rate of the heat sink with the printed wiring board and IC temperature rise.

FIG. 18 is a graph indicating a relationship between a solder bonding rate and a temperature of the IC when a predetermined consumed electric power is applied to the IC chip. Here, the solder bonding rate is a rate of a bonding area of the heat sink and the printed wiring board to an area of the heat sink of the IC chip. It can be seen from this graph that the heat is radiated from the IC chip in a region in which the solder bonding rate is 10% or more and that the increase of temperature is kept low. Therefore, it is necessary to connect the heat sink with the conductor plane of the printed wiring board with a region of 10% or more of the area of the heat sink in passing through the bypass circuit 1341.

Seventh Embodiment

Because the bypass circuit 1341 illustrated in FIG. 15 is disposed on the same surface side of the printed wiring board 1302 with the driving IC 101 in the sixth embodiment, a gap between the bypass circuit 1341 and the heat sink 1321 is narrow. Due to that, there is a possibility that the bypass circuit 1341 and the heat sink 1321 may cause an electrical short depending on variation of an amount of the conductive material 1520 such as solder, on variation of installation positions in a part mounting process or on variation of a thickness of the resist on the surface of the printed wiring board 1302. The seventh embodiment provides a configuration which avoids or reduces the possibility of the short.

Figure 19:
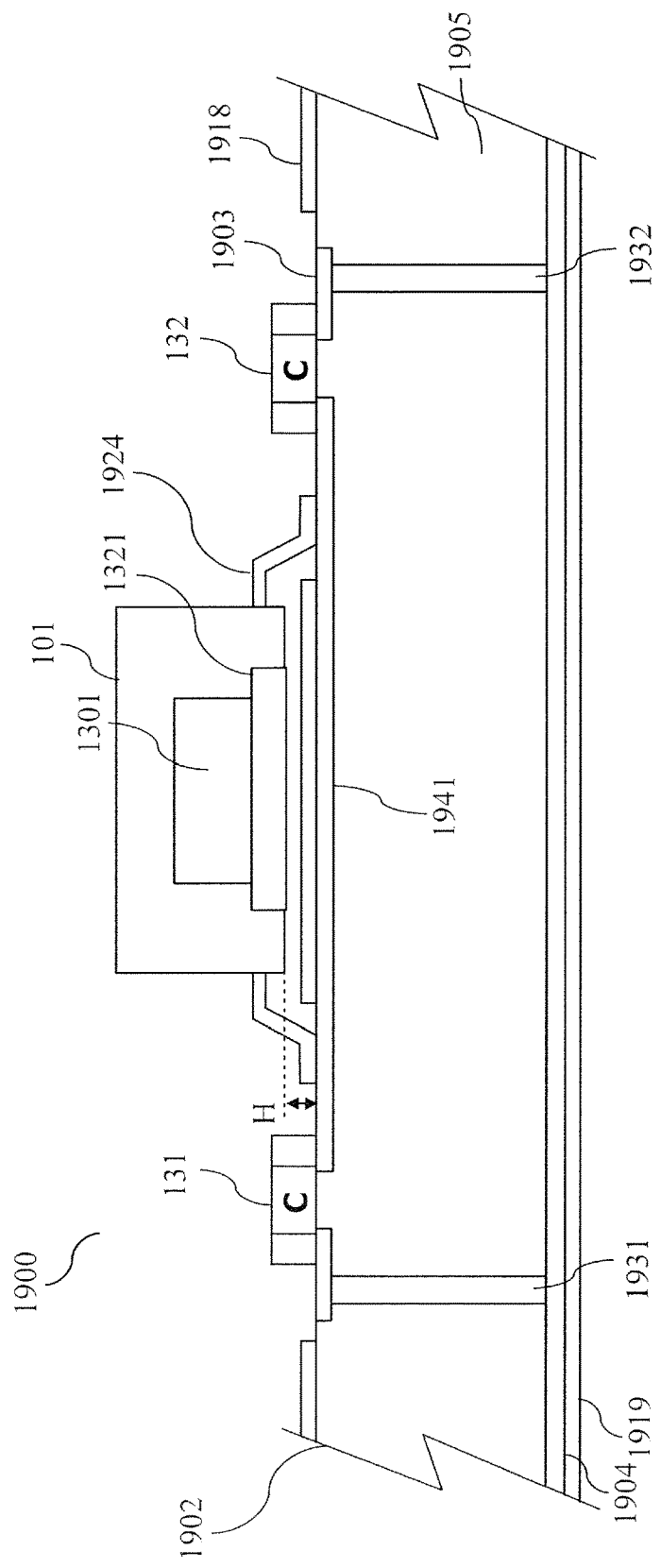
FIG. 19 is a section view of a printed circuit board of a seventh embodiment.

FIG. 19 is a section view of a section E-E' in a case where the seventh embodiment is applied to the configuration illustrated in FIG. 13. In this case, the driving IC 101 is an IC having a standoff height H like SOP and QFP and can keep a height of the driving IC 101 by an outer circumferential pin 1924. Because this arrangement makes it possible to keep insulation by assuring a certain distance H or more between the heat sink 1321 and the bypass circuit 1941, it is possible to prevent an electrical short.

Figure 20:
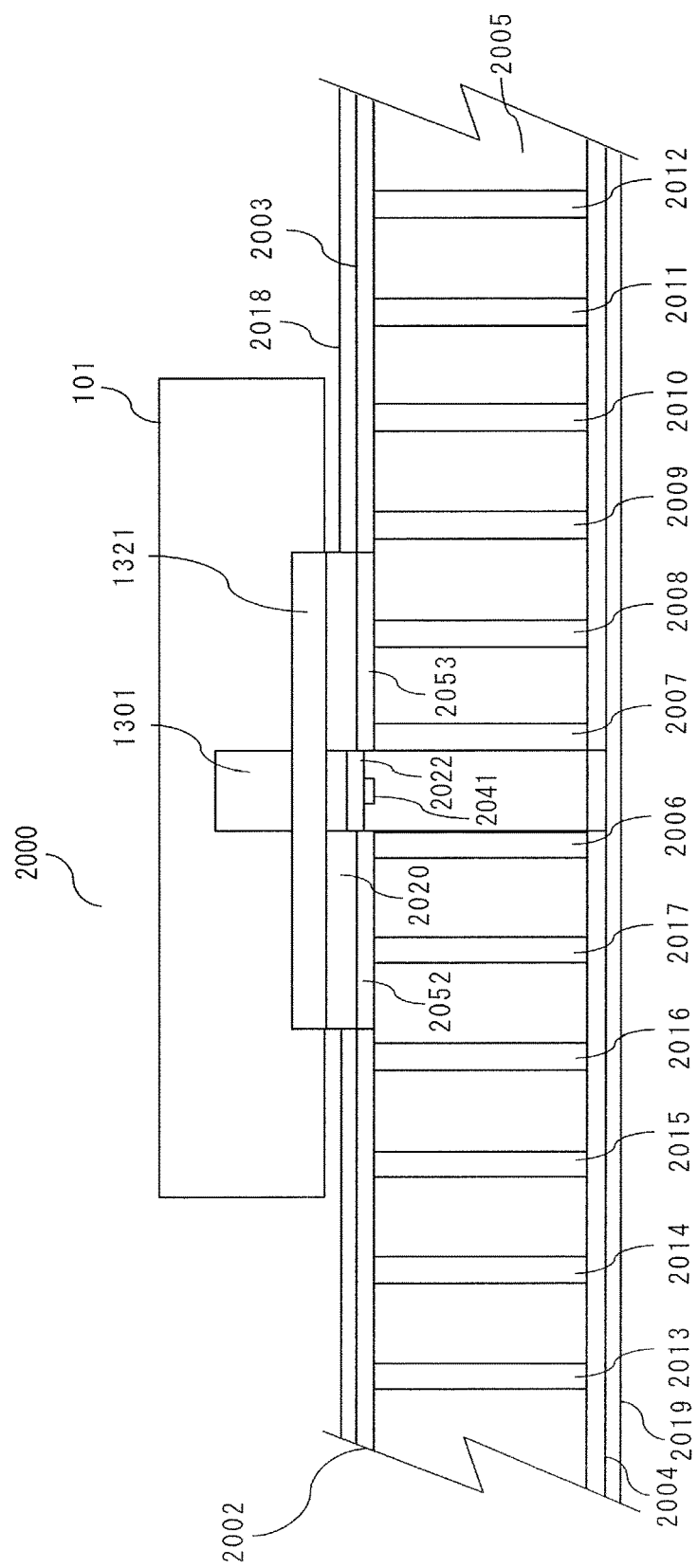
FIG. 20 is a section view of a printed circuit board of a first modified example of the seventh embodiment.

FIG. 20 is a section view of a printed circuit board of a first modified example of the seventh embodiment taken along a direction corresponding to a line D-D' in FIG. 13. In the printed wiring board 2002, a thickness of a conductor of a bypass circuit 2041 is thinner than a thickness of a conductor of a conductor plane 2003. This arrangement makes it possible to keep insulation by assuring a distance between the bypass circuit and the heat sink and to prevent an electrical short.

Figure 21:
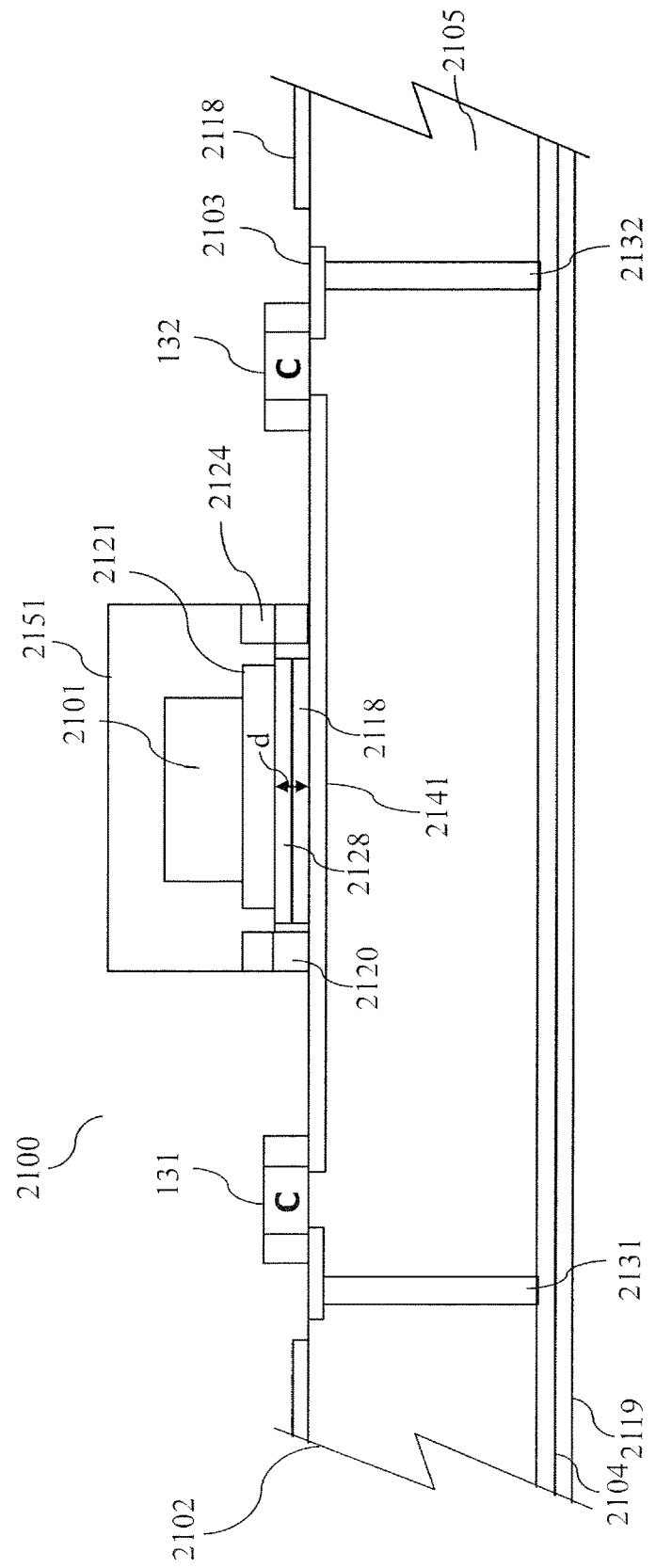
FIG. 21 is a section view of a printed circuit board of a second modified example of the seventh embodiment.

FIG. 21 is a section view of a printed circuit board of a second modified example of the seventh embodiment taken along a direction corresponding to a line E-E' in FIG. 13. A driving IC 2151 adopts an IC having no standoff height such as QFN. In order to assure a distance d between a heat sink 2121 of the driving IC 2151 and a bypass circuit 2141, the bypass circuit 2141 is covered by an insulating material. Specifically, in order to keep the distance between the bypass circuit 2141 and the heat sink 2121, a solder resist 2128 is added in addition to a normal solder resist 2118. It is possible to increase insulation and to prevent an electrical short between the heat sink 2121 and the bypass circuit 2141 by partially thickening the solder resist by thus doubling the resists or by adding insulator such as silk on the solder resist.

In a case when an amount of the conductive material 2020 for bonding the driving IC 101 with the printed wiring board 2002 as illustrated in FIG. 20 is large, the conductive material 2020 is squashed by a load of the driving IC 101 in mounting the parts. Due to that, the conductive material 2020 enters between the bypass circuit 2041 and the heat sink 1321, thus possibly lowering insulation between the heat sink 1321 and the bypass circuit 2041.

Figure 22:
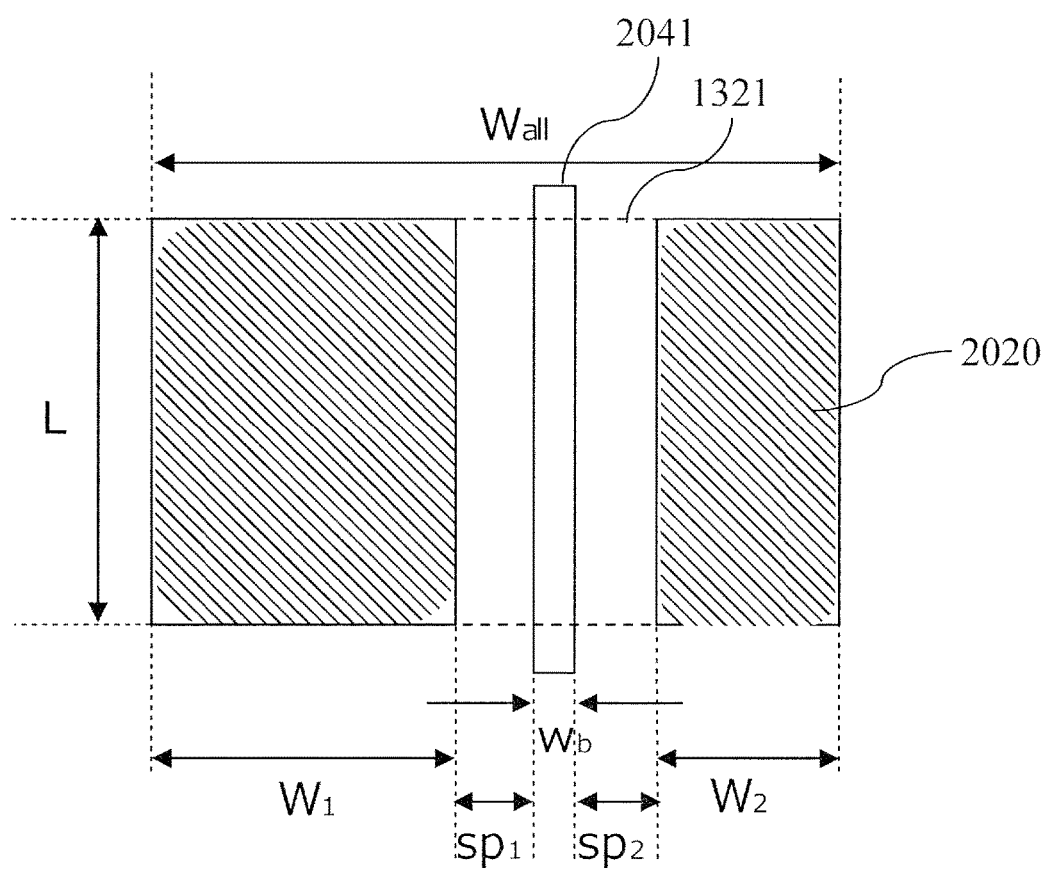
FIG. 22 is a top view of a land portion and a bypass circuit of the printed wiring board, where the heat sink is to be bonded in the seventh embodiment.

FIG. 22 is a top view of lands 2052 and 2053, and the bypass circuit 2041 illustrated in FIG. 20, before the driving IC 101 is mounted in the seventh embodiment. The heat sink 1321 is bonded with the lands 2052 and 2053 of the printed wiring board 2002. The conductive material 2020 as illustrated by shaded areas in FIG. 22 is disposed along shapes of the lands 2052 and 2053 of the printed wiring board 2002 for bonding with the heat sink 1321 in a stage before mounting the driving IC 101.

Figure 23:
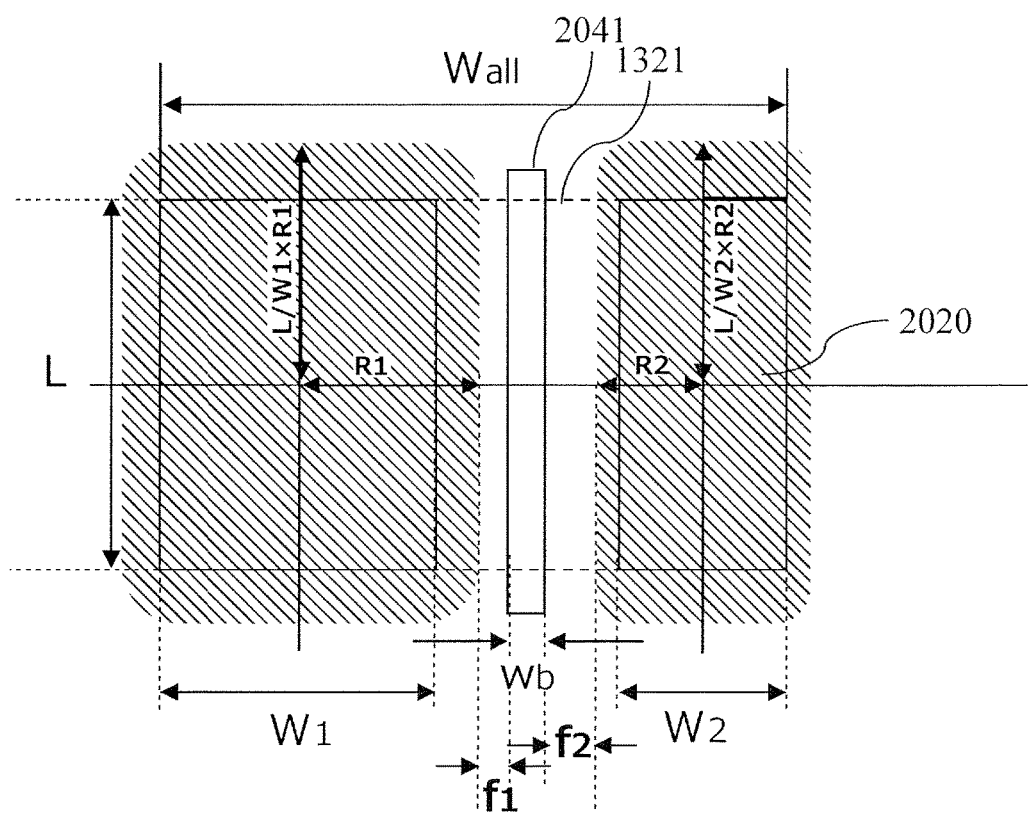
FIG. 23 is a top view of the land portion and the bypass circuit of the printed wiring board, where the heat sink was bonded after mounting the driving IC in the seventh embodiment.

FIG. 23 is a top view of the lands 2052 and 2053, and the bypass circuit 2041 of the seventh embodiment illustrated in FIG. 20, where the heat sink 1321 is bonded on the printed wiring board 2002 after mounting the driving IC 101. The conductive material 2020 spreads by the load of the driving IC 101 and a distance with the bypass circuit 2041 is shortened. Due to that, a distance between the conductive material 2020 and the bypass circuit has to be taken by at least greater than zero in the printed wiring board 2002 for mounting the driving IC 101.

The abovementioned description will be described by using numerical expressions. A vertical length of the land 2052 for the heat sink 1321 is denoted by L, a horizontal length of the land on the left side of the bypass circuit is denoted by W1 and that of the land 2053 on the right side by W2. A gap between the land 2052 on the left side of the bypass circuit 2041 and the bypass circuit 2041 is denoted by sp1 and a gap between the land 2053 on the right side of the bypass circuit 2041 and the bypass circuit 2041 is denoted by sp2. Assuming that the spread of the conductive material 2020 after mounting the driving IC 101 keeps an aspect ratio, the spread of the conductive material in the horizontal direction based on a center of the land 2052 located on the left side of the bypass circuit 2041 is denoted by R1. The spread of the conductive material in the horizontal direction based on a center of the land 2053 located on the right side of the bypass circuit 2041 is denoted by R2. A gap between the conductive material 2020 and the bypass circuit 2041 on the left side is denoted by f1, and a gap between the conductive material 2020 and the bypass circuit 2041 on the right side is denoted by f2. Then, the following equation holds.

$$f_1 = \frac{W_1}{2} + sp - R_1, f_2 = \frac{W_2}{2} + sp - R_2 \quad \text{Eq. 4}$$

Volumes of the conductive material 2020 on the left and right sides of the bypass circuit 2041 are denoted by V1 and V2, respectively. A distance, i.e., a height, between the lands 2052 and 2053 of the printed wiring board 2002 for the heat sink and the heat sink 1321 is denoted by h, the following equation holds as for the spreads R1 and R2.

$$R_1 = \sqrt{\frac{V_1}{h \times 4} \times \frac{W_1}{L}}, R_2 = \sqrt{\frac{V_2}{h \times 4} \times \frac{W_2}{L}} \quad \text{Eq. 5}$$

The following equation holds from the equations 4 and 5.

$$f_1 = \frac{W_1}{2} + sp - \sqrt{\frac{V_1}{h \times 4} \times \frac{W_1}{L}}, f_2 = \frac{W_2}{2} + sp - \sqrt{\frac{V_2}{h \times 4} \times \frac{W_2}{L}} \quad \text{Eq. 6}$$

Therefore, the volume of the conductive material 2020, the distance between the lands 2052 and 2053 of the printed wiring board 2002 for heat sink and the heat sink 1321, and the distance between the land of the heat sink 1321 and the bypass circuit 2041 are designed such that f1>0, and f2>0 in the equation 6. Thereby, the conductive material 2020 hardly enters between the bypass circuit 2041 and the heat sink 1321.

Eighth Embodiment

The printed circuit board of the present disclosure including the respective embodiments described above can be suitably used as a circuit for supplying power to motors driving various rollers provided in an electro-photographic image forming apparatus such as a laser beam printer and a copier and in an inkjet-type image forming apparatus for example.

Figure 29:
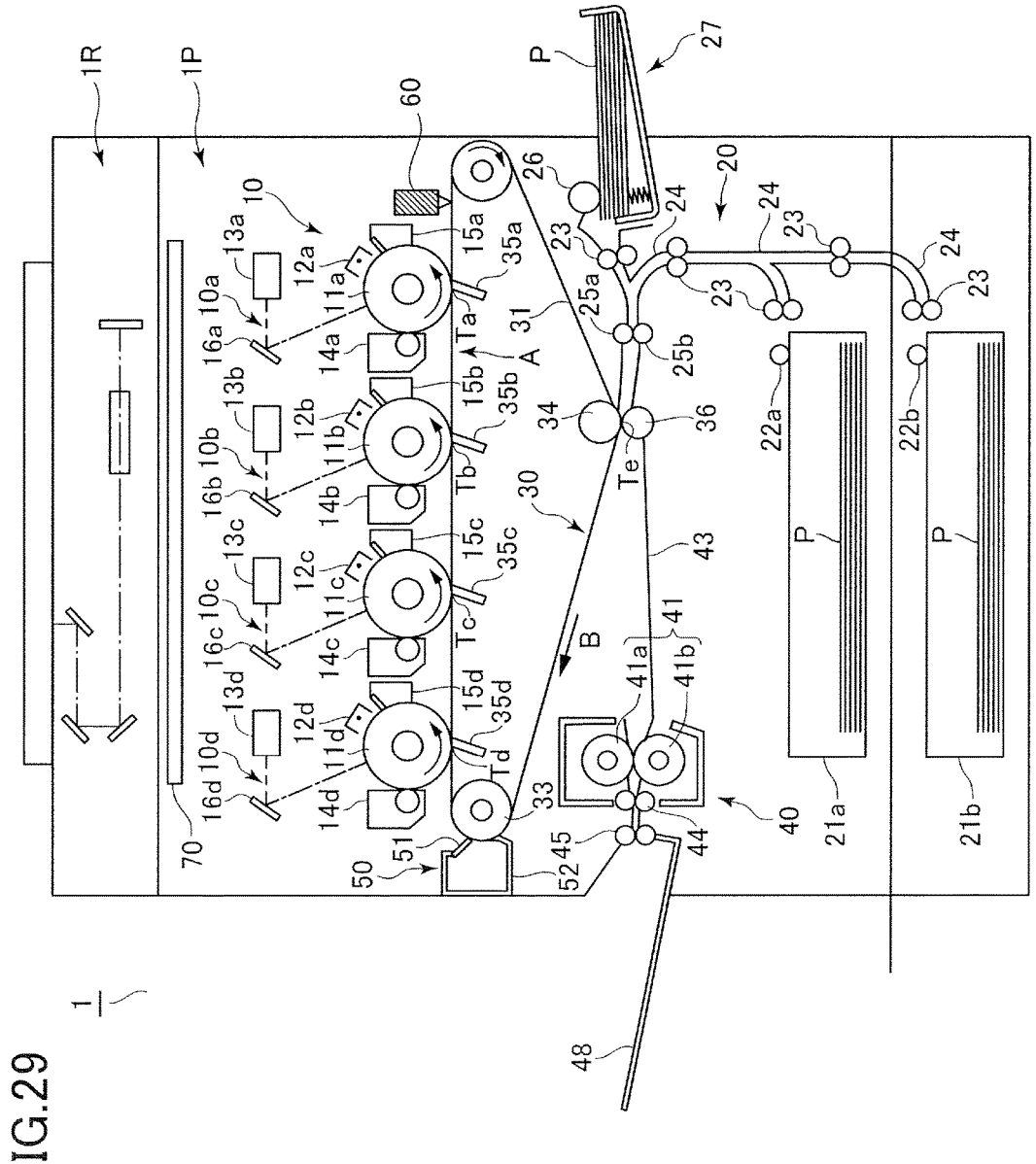
FIG. 29 is a longitudinal section view illustrating a schematic configuration of an image forming apparatus of the present disclosure.

FIG. 29 is a section view illustrating an exemplary schematic configuration of the electro-photographic image forming apparatus which is one example of the image forming apparatus to which the printed circuit board of the present disclosure is applied. The electro-photographic image forming apparatus 1 in FIG. 29 includes a reader portion, i.e., an optical system, 1R in an upper part thereof and a printer portion, i.e., an image output portion, 1P in a lower part thereof. The image forming apparatus 1 reads an image of a document by the reader portion 1R and transfers the image, i.e., a toner image, to a transfer member P in the printer portion 1P based on image information from the reader portion 1R. The image forming apparatus 1 as illustrated in FIG. 29 includes a plurality (four here) of image forming stations 10a, 10b, 10c and 10d arrayed in parallel in an image forming portion 10 of the printer portion 1P and adopts an intermediate transfer body system.

The printer portion 1P is roughly composed of the image forming portion 10, a sheet feeding portion 20, an intermediate transfer portion 30, a fixing portion 40 and a control portion 80 not illustrated.

The image forming portion 10 includes the four image forming stations 10a, 10b, 10c and 10d which are constructed approximately in the same manner and which form toner images of yellow (Y), cyan (C), magenta (M) and black (K), respectively, in this order. In the respective image forming stations 10a, 10b, 10c and 10d, drum-type electro-photographic photosensitive members (referred to as a 'photosensitive drum' hereinafter) 11a, 11b, 11c and 11d serving as image bearing members are axially supported at centers thereof and are rotationally driven in directions of arrows, i.e., counterclockwise in FIG. 29. Disposed facing an outer circumferential surface of each of the photosensitive drums 11a through 11d in a rotation direction thereof are primary chargers (charging units) 12a, 12b, 12c and 12d, and optical exposure units (irradiation unit) 13a, 13b, 13c and 13d. Disposed still further facing the outer circumferential surface of the photosensitive drums are return mirrors 16a, 16b, 16c and 16d and developing units (bias member) 14a, 14b, 14c and 14d. Each of the photosensitive drums 11a through 11d described above includes an earthed conductive drum base not illustrated as a base layer and a photosensitive layer not illustrated and provided so as to coat an outer circumferential surface of the drum base.

Electric charge of homogeneous electric charge amount is applied to the surface of the photosensitive layer 11B of the respective photosensitive drums 11a through 11d at the primary chargers 12a through 12d. Next, an electrostatic latent image is formed on each of the photosensitive drums 11a through 11d by each of the exposure units 13a through 13d that exposes a light beam (exposure light), e.g., a laser beam, modulated corresponding to the image signal on the photosensitive drums 11a through 11d by the return mirrors 16a through 16d. The electrostatic latent images are then visualized as toner images, i.e., developed images, by the developing units 14a through 14d in which four color developers (referred to as 'toner' hereinafter) of yellow, cyan, magenta and black are stored. The visualized toner images are then (primarily) transferred onto image transfer areas Ta, Tb, Tc and Td of an intermediate transfer belt 31 serving as an intermediate transfer body. The photosensitive drums 11a through 11d rotate, and cleaning units 15a, 15b, 15c and 15d clean the surface of the drums by scraping out the toners left on the photosensitive drums 11a through 11d without being transferred onto the intermediate transfer belt 31 after passing through the image transfer areas Ta through Td. The image forming processes are performed sequentially by the respective toners under the process described above.

The sheet feeding portion 20 feeding a sheet of paper serving as a recording medium P includes cassettes 21a and 21b or a manual feed tray 27 for storing the sheets P and pickup rollers 22a, 22b and 26 for delivering the recording medium P one by one out of the cassettes or the tray. The sheet feeding portion 20 also includes a conveyance mechanism composed of a plurality of conveying roller pairs 23 and a feed guide 24 for conveying the recording medium P delivered by the respective pickup rollers 22a, 22b and 26 to registration rollers 25a and 25b. The registration rollers 25a and 25b deliver the recording medium P to a secondary transfer area Te by synchronizing with image forming timing of the image forming portion 10.

The intermediate transfer portion 30 is provided with the endless intermediate transfer belt 31. The intermediate transfer belt 31 is wrapped around three rollers, i.e., a driving roller 32 transmitting drive force to the intermediate transfer belt 31, a driven roller 33 driven following the turn of the intermediate transfer belt 31 and a counter roller 34 facing the secondary transfer area Te while interposing the intermediate transfer belt 31. A primary transfer plane A is formed between the driving roller 32 and the driven roller 3 among these rollers. A surface of a metallic roller of the driving roller 32 is coated by rubber of several mm thick (urethane or chloroprene rubber) to prevent the roller from causing a slip with the intermediate transfer belt 31. The driving roller 32 is rotationally driven by a pulse motor not illustrated in a direction of an arrow in FIG. 29, and thereby the intermediate transfer belt 31 is rotated in a direction of an arrow B.

The primary transfer plane A is configured so as to face the respective image forming portions 10a through 10d and such that the respective photosensitive drums 11a through 11d face the primary transfer plane A of the intermediate transfer belt 31. Accordingly, the primary transfer areas Ta through Td are located on the primary transfer plane A. Primary transfer chargers 35a, 35b, 35c and 35d are disposed on a back of the intermediate transfer belt 31 in the primary transfer areas Ta through Td where the respective photosensitive drums 11a through 11d face the intermediate transfer belt 31. The secondary transfer roller 36 is disposed so as to face the counter roller 34, and the secondary transfer area, i.e., the transfer portion, Te is formed by a nip formed between the secondary transfer roller 36 and the intermediate transfer belt 31. The secondary transfer roller 36 is pressed against the intermediate transfer belt 31 with adequate pressure. A belt cleaner 50 is disposed downstream of the secondary transfer area Te on the intermediate transfer belt 31 at a position corresponding to the driven roller 33. The belt cleaner 50 includes a cleaning blade 51 for cleaning an image forming surface of the intermediate transfer belt 31 and a waste toner box 52 for storing waste toner swept by the cleaning blade 51.

The fixing portion 40 is provided with a fixing unit 41 including a fixing roller 41a within which a heat source such as a halogen heater is provided and a pressure roller 41b pressed against the fixing roller 41a. The fixing unit 41 is also provided with a guide 43 for guiding the recording medium P to a nip portion of these roller pair 41a and 41b, an inner discharge roller pair 44, an outer discharge roller pair 45 and others for discharging the recording medium P that has been discharged by the roller pair 41a and 41b onto a discharge tray 48 located outside of the image forming apparatus.

While a case where the recording medium is a sheet of paper has been described above, the recording medium needs not be a sheet of paper and may be a sheet-like material as long as the sheet allows a toner image to be transferred and fixed thereon.

Figure 30:
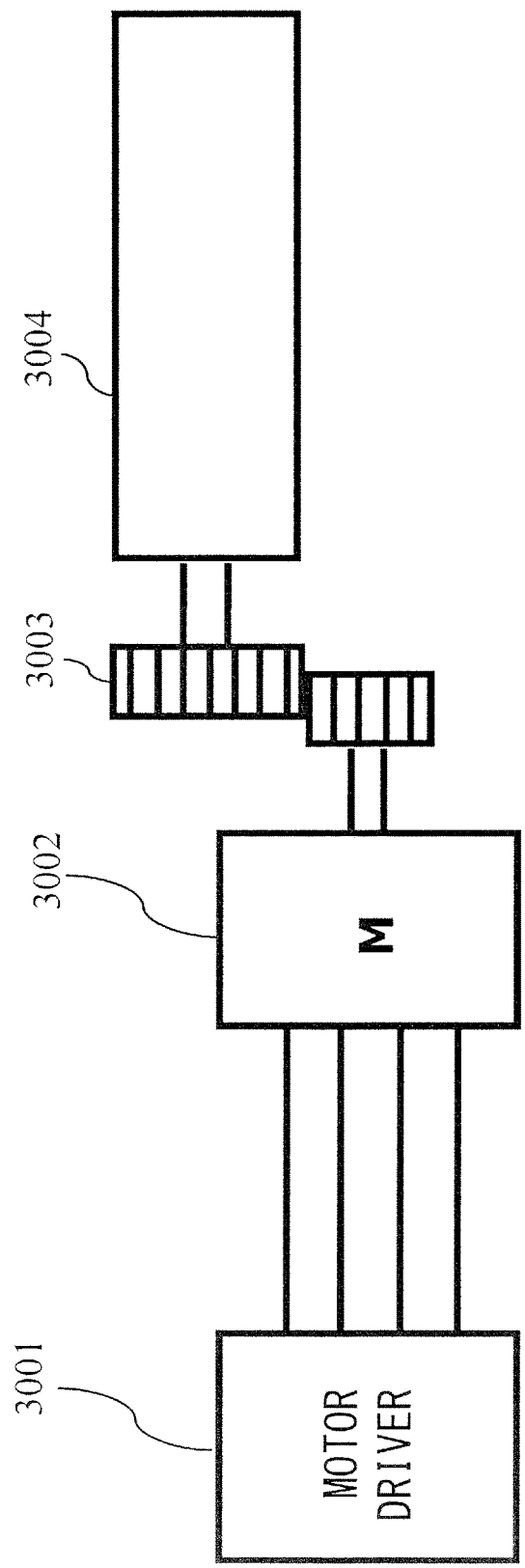
FIG. 30 illustrates a schematic configuration of a motor driving portion of the present disclosure.

FIG. 30 illustrates a schematic configuration of the motor driving portion of the present disclosure. A motor driver 3001 controls an amount, a direction, timing and others of an electric current flown through a motor 3002. A reduction gear 3003 is a converting mechanism that connects the motor 3002 with a roller 3004 (corresponds to the roller 32 in FIG. 29) for driving a belt for example and reduces and converts a number of rotations of the motor 3002 to a predetermined number of rotations. Thus, the rotational speed of the roller is controlled by a drive signal of the motor driver through the motor and the reduction gear.

The printed circuit board of the present disclosure is preferable as a motor driver circuit of motors connected to the driving motors for use in the photosensitive drum, the developer, the sheet feeding portion, the sheet conveyance portion, the registration portion, the fixing portion and the belt conveyance portion in the image forming apparatus described above. Because a large current of several amperes is supplied to drive these motors, radiated noise is large, giving a large influence around the image forming apparatus. If the printed circuit board of the present disclosure is used as the motor driver circuit, it becomes possible to supply power to the motors fast with low radiated noise.

Still further, because the IC supplying the large current consumes much power, it generates much heat quantity.

Then, if the printed circuit board assuring the heat dissipating path described in the sixth embodiment is adopted as the driver circuit for supplying power to the driving rollers of the image forming apparatus, it is possible to suppress the temperature rise of the ICs and to realize more stable drive.

While the electro-photographic image forming apparatus has been specifically described in the present embodiment, the printed circuit board of the present disclosure can be applied also to an image forming apparatus forming an image by an inkjet system in an image forming portion. Because the inkjet-type image forming apparatus is configured to form an image directly on a recording medium by an inkjet head, the inkjet-type image forming apparatus includes no transfer portion and fixing portion unlike the electro-photographic image forming apparatus. However, a system for supplying power to rollers provided in a conveyance mechanism has a similar problem with that of the electro-photographic image forming apparatus, so that the printed circuit board of the present disclosure is preferable as a driver circuit for supplying power to the motors of the rollers provided in the conveyance mechanism. The printed circuit board of the present disclosure is not limited to that for supplying power to various rollers provided in the image forming apparatus and may be used widely as circuits for supplying power in an electronic device provided with a member that requires power to be supplied fast with low radiated noise.

Other Embodiment

The modes of the present disclosure are not limited to the first through eighth embodiments described above and can be modified or combined appropriately.

For instance, although the meandered portion has been provided in the first embodiment to form the bypass circuit by the conductive layer pattern of the printed wiring board, the shape of the conductive pattern is not limited to that and a desirable inductance or a resistor may be realized. The bypass circuit may be also configured by including the both of the conductive pattern like the meandered portion and the chip-type element.

Still further, while the driving circuit of a two-phase motor or a three-phase motor has been described in the above embodiments, the bypass circuit may be provided in a driving circuit of a motor driven in four or more phase. In short, the power supplying unit of the present disclosure provided with the bypass circuit may be preferably used in an image forming apparatus provided with a polyphase motor to which plural-phase (different-phase) power is supplied.

Exemplary Embodiments

First Exemplary Embodiment

A first exemplary embodiment of the present disclosure will be described below. The printed wiring board 202 was designed as follows in the configuration of the printed circuit board 200 illustrated in FIGS. 2 and 3.

The two-layered printed wiring board of 1.6 mm thick provided with conductive layers on the surface and the back thereof was used. A thickness of copper layer was 37 Voltage of the power source 130 was 24 V, and power was supplied to the printed circuit board by a power cable. A wire diameter of the power cable was 0.4 mm and a length thereof was 420 mm. Thereby, inductance of the power cable was calculated to be 620 nH each in the positive and negative lines.

An aluminum electrolytic capacitor of 100 μF of capacitance was disposed in a vicinity of terminals for drawing power from the power cable to the printed circuit board 200 to stabilize power source voltage. Then, the electrolytic capacitor 133 of 47 μF of capacitance was disposed at one end of the positive line 120 of 2.0 mm in width and 98 mm in length to stabilize low-frequency operations of the driving IC 101. Wire inductance between the two aluminum electrolytic capacitors was calculated to be 100 nH. It is noted that equivalent series resistance (ESR) of the aluminum electrolytic capacitor was set at 0.2Ω.

A width of the first positive wire 121 was 1 mm and a length thereof was 30 mm. A width of the second positive wire 122 was also 1 mm and a length thereof was 30 mm. Thereby, a resistive component of each positive wire was calculated to be 14 mΩ, and an inductance component was calculated to be 27 nH.

One end of each positive wire was connected with the electrolytic capacitor 133, and another end of each positive wire was connected with the power input terminal of the driving IC 101 and with the power supplying capacitors 131 and 132 of 0.1 μF of capacitance. Equivalent series resistance of the chip capacitor was set at 0.2Ω.

A wire width of the bypass circuit 141 was 0.1 mm and a length of the wire was 45 mm. Thereby, a resistive component of the bypass circuit was calculated to be 209 mΩ, and an inductance component was calculated to be 63 nH.

Assuming a rising/falling transmission time of the phase-A switching circuit 111 of the driving IC 101 is 100 ns, 1 A of current was flown with 40 kHz of frequency. The phase-B switching circuit 112 was assumed not to flow current simultaneously with the phase-A switching circuit 111, i.e., the phase-B switching circuit 112 operates with timing different from that of the phase-A switching circuit 111.

Figure 12A:
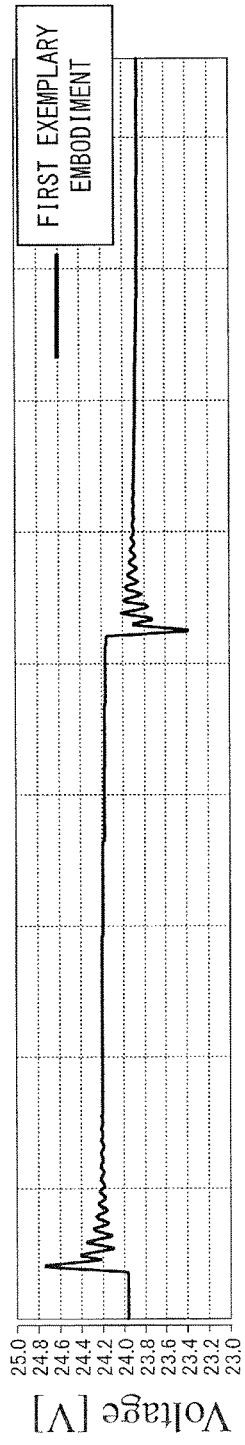
FIG. 12A is a graph indicating source voltage fluctuation of a first exemplary embodiment.

A voltage waveform at the power input terminal of the phase-A was simulated as for the first exemplary embodiment described above. FIG. 12A illustrates its result.

Second Exemplary Embodiment

A second exemplary embodiment of the present disclosure will be described below. A configuration of the second exemplary embodiment is the same with the first exemplary embodiment except of a configuration of the bypass circuit. As illustrated in the printed circuit board in FIGS. 7 and 8, the bypass circuit was constructed by using the chip-type element. A wire width of the conductive pattern of the bypass circuit was 0.1 mm and a wire length was 10 mm. Thereby, a resistive component of the bypass circuit was calculated to be 46 mΩ, and an inductance component was calculated to be 11 nH. A resistive element having a resistance value of 5.6Ω was used as the chip-type element 713 to fulfill the equation 3.

Figure 12B:
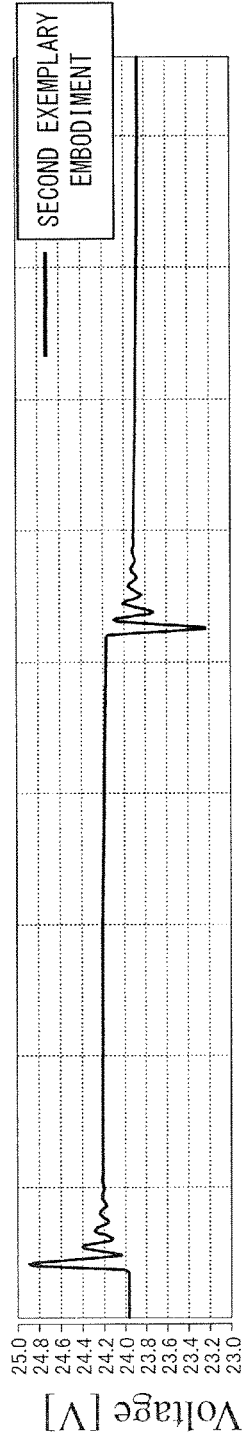
FIG. 12B is a graph indicating source voltage fluctuation of a second exemplary embodiment.

A voltage waveform at the power input terminal of the phase-A was simulated for the second exemplary embodiment described above. FIG. 12B indicates its result.

First Comparative Example

A first comparative example of the present disclosure will be described below. A configuration of the first comparative example is a printed circuit board similar to that of the first exemplary embodiment except of that no bypass circuit is provided.

Figure 12C:
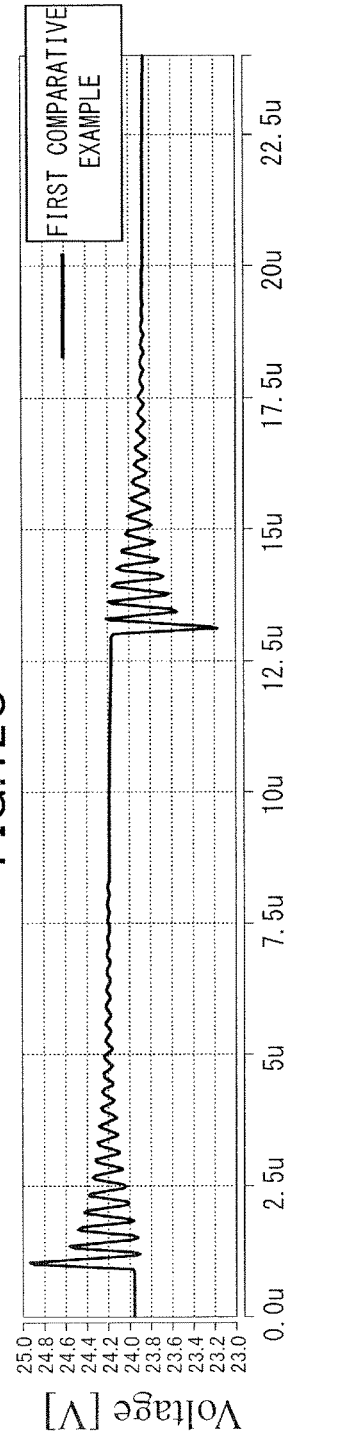
FIG. 12C is a graph indicating source voltage fluctuation of a first comparative example.

As for the first comparative example, a voltage waveform at the power input terminal of the phase-A was simulated. FIG. 12C indicates its result.

An axis of abscissa of each graph indicated in FIGS. 12A, 12B and 12C is time, and an axis of ordinate thereof is voltage. FIG. 12 permits to compare power source voltage fluctuations of the first exemplary embodiment, the second exemplary embodiment and the first comparative example.

In a case where current variation occurs by switching, voltage overshoots and reaches to 24.9 V and ringing of voltage fluctuation continues after that in the first comparative example. The ringing continues for a long time as compared to the first and second exemplary embodiments. When vibration (area) of the voltage fluctuation was calculated from the waveform chart, it was 0.48 μV·s per one transition.

Meanwhile, as for the first and second exemplary embodiments, in a case where current variation occurs by switching, while voltages reach to 24.8 V and 24.9 V, respectively, ringing of voltage fluctuation after that converge quickly as compared to the first comparative example. When vibrations (areas) of these voltage fluctuations were calculated from the waveform chart, they were 0.17 μV·s and 0.18 μV·s, respectively, per one transition.

That is, the vibrations of the first and second exemplary embodiments of the present disclosure are smaller than that of the first comparative example by around 9 dB as a result.

Still further, as it is apparent from the waveform chart, frequencies of the voltage fluctuations change. This indicates that the frequency and an amplitude level can be controlled by how impedance of the bypass circuit is applied.

In general, the greater the vibration of the high-frequency power source voltage, the larger the radiated noise is. Then, it can be said that the radiated noise hardly occurs when the vibration of the power source voltage is small like the exemplary embodiments of the present disclosure.

Third Exemplary Embodiment

A third exemplary embodiment of the present disclosure will be described below. A configuration of the third exemplary embodiment is the same with the first exemplary embodiment except of the configuration of the bypass circuit. As illustrated in FIGS. 13 through 15, the printed circuit board of the third exemplary embodiment is configured such that the heat sink 1321 of the driving IC 101 extends across the bypass circuit by using the conductive pattern. A wire width of the conductive pattern of the bypass circuit was 0.1 mm and a wire length was 7 mm. Thereby, a resistive component of the bypass circuit was calculated to be 33 mΩ, and an inductance component was calculated to be 8 nH.

Fourth Exemplary Embodiment

A fourth exemplary embodiment of the present disclosure will be described below. A configuration of the fourth exemplary embodiment is the same with the third exemplary embodiment except of a layered configuration of the printed wiring board. The fourth exemplary embodiment is different from the third exemplary embodiment in that the printed wiring board is a single-sided board and includes no through-hole and no conductive pattern on the back like the printed wiring board 2402 illustrated in FIG. 24. A wire width of the conductive pattern of the bypass circuit was 0.1 mm and a wire length was 7 mm. Thereby, a resistive component of the bypass circuit was calculated to be 33 mΩ, and an inductance component was calculated to be 8 nH.

Fifth exemplary embodiment

A fifth exemplary embodiment of the present disclosure will be described below. A configuration of the fifth exemplary embodiment is the same with the fourth exemplary embodiment except of a configuration of the bypass circuit. Specifically, while the bypass circuit 2441 is disposed right under the IC chip 1301 in the fourth exemplary embodiment, the bypass circuit 2541 is disposed at a position on the right side of the IC chip 1301, i.e., at a position not under the center of the IC chip 1301, in the fifth exemplary embodiment. A wire width of the conductive pattern of the bypass circuit was 0.1 mm and a wire length thereof was 11 mm. Thereby, a resistive component of the bypass circuit was calculated to be 51 mΩ, and an inductance component was calculated to be 12 nH.

As for the third through fifth exemplary embodiments, a voltage waveform at the power input terminal of the phase-A was simulated. FIG. 26A through 26C indicate its result.

The first comparative example described above was used as a comparative example. Its result is indicated in FIG. 26D.

The structures and lengths of the bypass circuit are same in the third and fourth exemplary embodiments, so that the same result was brought about. In a case where current variation occurs by switching, voltages reach to 24.6 V and 24.6 V, respectively, and ringing of voltage fluctuation after that converge quickly as compared to the first comparative example. When vibrations (areas) of these voltage fluctuations were calculated from the waveform chart, they were 0.11 μV·s and 0.11 μV·s, respectively, per one transition. As for the fifth exemplary embodiment, in a case where current variation occurs by switching, voltages reach to 24.5 V and ringing of voltage fluctuation after that converge quickly as compared to the first comparative example. When vibrations (areas) of the voltage fluctuation was calculated from the waveform chart, it was 0.12 μV·s per one transition.

That is, as compared to 0.48 μV·s of the vibration (area) of the voltage vibration of the first comparative example, the vibrations of the third through fifth exemplary embodiments of the present disclosure are less by around 12 dB, 12 dB and 11 dB, respectively, as a result.

Next, an influence on the temperature rise of the driving IC 101 in the third exemplary embodiment was estimated by simulation. The temperature rise was evaluated by changing the position of the bypass circuit with respect to the through-holes 1506 through 1512 in FIG. 15.

As a verification condition, the evaluation was made under an environment of natural convection basically based on the JEDEC standard (JESD51). As for the driving IC with a heat sink, a 28-pin SOP package with 9.7 mm×6.4 mm×1.0 mm in size and 0.65 mm in pitch was used. A chip size was 1.0 mm×2.2 mm×0.38 mm, and power consumption was 1.0 W.

The printed wiring board was the two-layered board of 70 mm×70 mm×1.6 mm, and a land of 0.6 mm and the through-holes of 0.3 mm in drill diameter were disposed by 12×3 at intervals of 1.2 mm right under and around the driving IC. A slit width dividing the conductor plane by the bypass circuit was 0.6 mm. Ambient temperature was set at 50° C.

Figure 27:
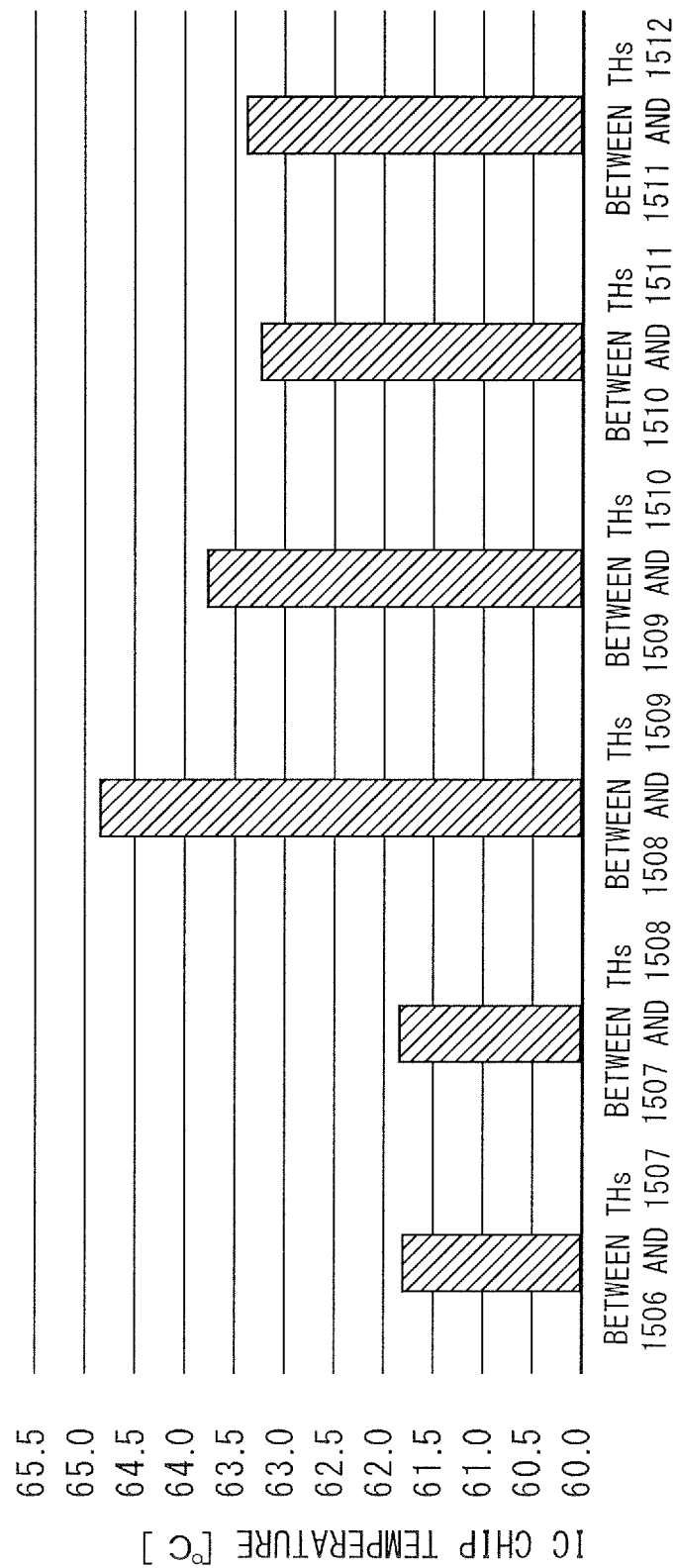
FIG. 27 is a graph indicating a simulation result of IC temperature in the third exemplary embodiment.

FIG. 27 is a graph indicating a simulation result of the IC temperature in the third exemplary embodiment. A state in which the IC chip temperature changes depending on the position of the bypass circuit was expressed by bar graphs.

FIG. 27 indicates that values of the temperature rise of the IC chip change depending on the position where the heat radiating conductor plane is divided by disposing the bypass circuit. More specifically, the IC chip temperature was lowest in a case where the bypass circuit was disposed between the through-holes 1506 and 1507 and was 61.8° C. The temperature was also 61.8° C. equally in a case where the bypass circuit was disposed between the through-holes 1507 and 1508. Meanwhile, in a case where the bypass circuit was disposed between the through-holes 1508 and 1509, the temperature changed sharply to 64.9° C. This happened because the heat dissipating path to the right direction on the surface side of the printed wiring board was disconnected by an area for providing the bypass circuit in radiating the heat generated in the IC chip 1501 in FIG. 15 through the printed wiring board 1302. The IC chip temperatures were 63.8° C., 63.2° C. and 63.4° C. when the bypass circuit was disposed between the through-holes 1509 and 1510, between the through-holes 1510 and 1511 and between the through-holes 1511 and 1512, respectively. It can be seen from the simulation result of the IC chip temperature described above that the case where the bypass circuit is disposed such that the heat sink divides the conductor plane so as to extend across the heat sink, i.e., the case where the thermal conductive route by which the heat sink 1321 is connected with the areas a and b, respectively, of the conductor plane 1503 through the conductive material 1520 is assured, is superior in an aspect of heat radiating characteristics.

Still further, an influence on the temperature rise of the driving IC 101 in the fourth and fifth exemplary embodiments was estimated by simulation. The fourth exemplary embodiment was different from the third exemplary embodiment in the layer structure of the printed wiring board described above. An analysis condition was the same with the third exemplary embodiment other than that. The fifth exemplary embodiment was different from the fourth exemplary embodiment in that the position of the bypass circuit of the printed wiring board described above is different. An analysis condition was the same with the fourth exemplary embodiment other than that.

Figure 28:
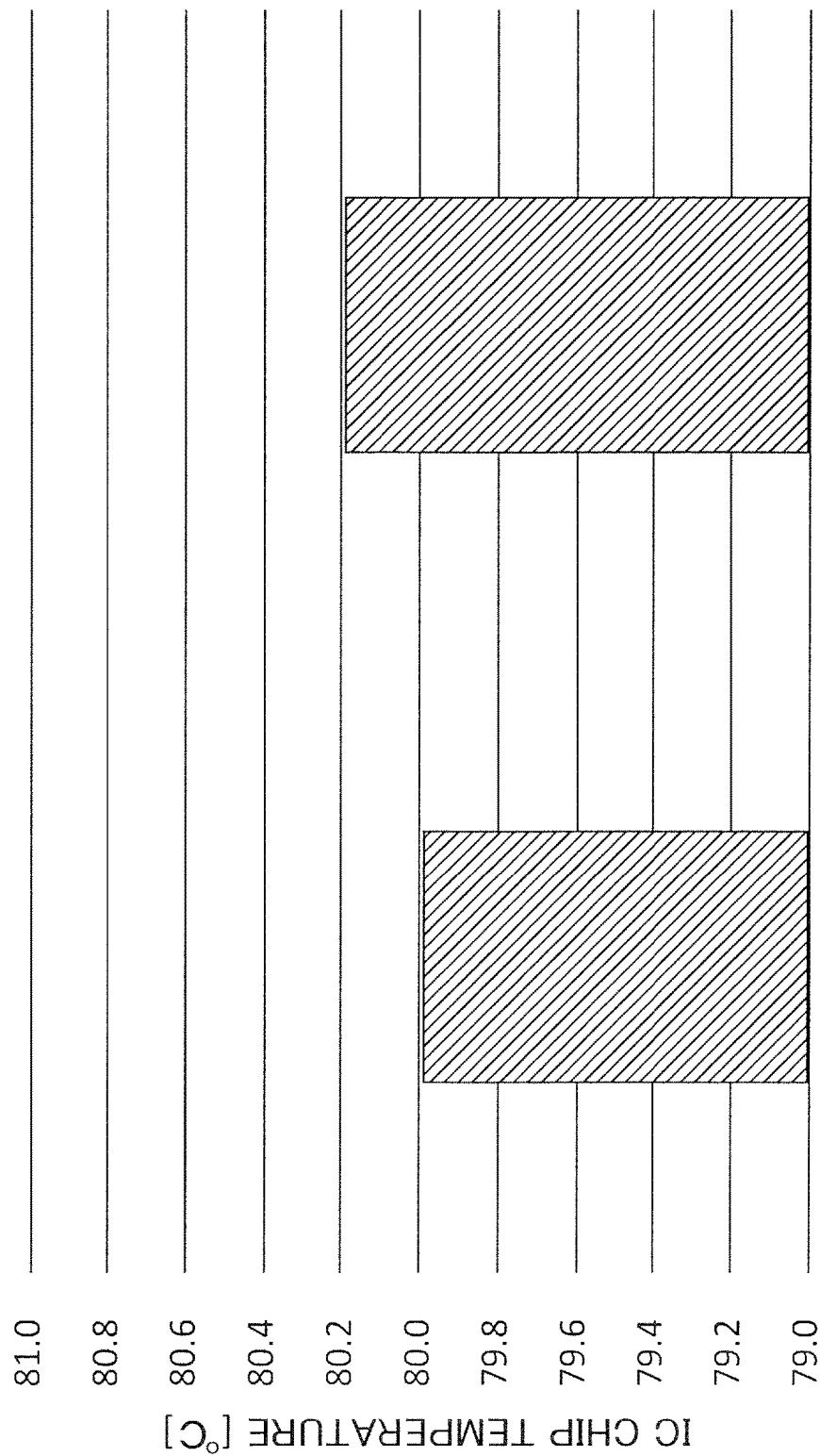
FIG. 28 is a graph indicating simulation results of IC temperatures in the fourth and fifth exemplary embodiments.

FIG. 28 is a graph indicating the simulation result of the IC temperature in the fourth and fifth exemplary embodiments. Because a number of layers of the printed wiring board was reduced from two to one layer, i.e., the single-sided board, and an area of the heat radiating conductor plane was reduced as compared with the third exemplary embodiment, values of the temperature increased and the IC chip temperature became 80.0° C. and 80.2° C., respectively. Although a difference of the values of temperature rise of the fourth and fifth exemplary embodiments was small, it was found that the fourth exemplary embodiment in which the bypass circuit passes through right under the IC chip is superior more or less in terms of heat radiating characteristics.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-144925, filed Jul. 26, 2017, and Japanese Patent Application No. 2018-094135, filed May 15, 2018, which are hereby incorporated by reference wherein in their entirety.

What is claimed is:

1. A printed circuit board comprising:
   a power input terminal;
   a positive trunk line connected with a positive electrode of the power input terminal;
   a negative trunk line connected with a negative electrode of the power input terminal;
   a first switching circuit controlling connection/disconnection of power supply to a load;
   a second switching circuit controlling connection/disconnection of power supply to a load;
   a first positive wire connecting the positive trunk line with the first switching circuit without passing through the second switching circuit;
   a second positive wire connecting the positive trunk line with the second switching circuit without passing through the first switching circuit;
   a first capacitor provided between the first positive wire and the negative trunk line;
   a second capacitor provided between the second positive wire and the negative trunk line; and
   a bypass circuit connecting the first positive wire with the second positive wire.

2. The printed circuit board according to claim 1, further comprising a third capacitor, having capacitance greater than any one of the first and second capacitors, between the positive trunk line and the negative trunk line.

3. The printed circuit board according to claim 1, wherein the following equation is fulfilled, where impedance of the bypass circuit is denoted by Z, a transition time of the first switching circuit is denoted by Tsw, and capacitance of the second capacitor is denoted by C $$\frac{1.4 \times T_{sw}}{C} \leq Z.$$

4. The printed circuit board according to claim 1, wherein the first and second switching circuits are mounted on a printed wiring board and the bypass circuit comprises a conductive path formed on the printed wiring board.

5. The printed circuit board according to claim 1, wherein the first and second switching circuits are mounted on a printed wiring board and the bypass circuit comprises a meander-shaped conductive pattern formed on the printed wiring board.

6. The printed circuit board according to claim 1, wherein the first and second switching circuits are mounted on a printed wiring board and the bypass circuit comprises a chip-type element mounted on the printed wiring board.

7. The printed circuit board according to claim 1, wherein the first and second positive wires are disposed symmetrically on a printed wiring board.

8. The printed circuit board according to claim 1, wherein the first and second switching circuits are provided on a same IC chip and the first and second positive wires are disposed symmetrically with respect to the IC chip.

9. The printed circuit board according to claim 1, wherein the first and second switching circuits are provided on a same IC chip,
the IC chip is bonded with a printed wiring board through a heat sink and a conductive material,
the negative trunk line is provided in an area which includes an area facing the heat sink on a surface of the printed wiring board on which the IC chip is mounted and which is wider than the area facing the heat sink,
the bypass circuit is provided in the area facing the heat sink on the surface of the printed wiring board on which the IC chip is mounted so as to divide the negative trunk line into two areas; and
the heat sink is connected with the two areas of the negative trunk line through the conductive material.

10. The printed circuit board according to claim 9, wherein the bypass circuit is disposed right under the IC chip.

11. The printed circuit board according to claim 9, wherein an area by which the heat sink is connected with the negative trunk line through the conductive material is 10% or more in terms of an area of a surface of the heat sink facing the printed circuit board.

12. The printed circuit board according to claim 9, wherein a conductor thickness of a wire of the bypass circuit is thinner than a conductor thickness of the negative trunk line.

13. The printed circuit board according to claim 9, wherein an IC package including the IC chip is provided with lead terminal groups at least at two sides or more and has a standoff height.

14. The printed circuit board according to claim 13, wherein a solder resist is provided on an upper surface of the bypass circuit and an outside of the IC package on a surface of the printed circuit board on which the IC package is mounted, and a thickness of the solder resist provided on the upper surface of the bypass circuit is thicker than the solder resist provided on outside of the IC package.

15. An image forming apparatus comprising:
an image forming portion configured to form an image;
a conveyance mechanism configured to convey a recording medium, wherein
the conveyance mechanism comprises a roller driven by a motor; and
a driver circuit configured to supply power to the motor driving the roller comprises the printed circuit board as set forth in claim 1.

16. An image forming apparatus comprising:
an image forming portion configured to form a toner image;
a conveyance mechanism configured to convey a recording medium;
a transfer portion configured to transfer the toner image onto the recording medium conveyed by the conveyance mechanism; and
a fixing portion configured to fix the toner image transferred in the transfer portion onto the recording medium,
wherein each of the image forming portion, the conveyance mechanism, the transfer portion and the fixing portion comprises a roller driven by a motor, and
at least one driver circuit configured to supply power to at least one of the motor comprises the printed circuit board as set forth in claim 1.

* * * * *